(12) United States Patent
Goto et al.

(10) Patent No.: US 8,587,004 B2
(45) Date of Patent: Nov. 19, 2013

(54) SEMICONDUCTOR LIGHT EMITTING DEVICE, ITS MANUFACTURING METHOD, SEMICONDUCTOR DEVICE AND ITS MANUFACTURING METHOD

(71) Applicant: Sony Corporation, Tokyo (JP)

(72) Inventors: Osamu Goto, Kanagawa (JP); Takeharu Asano, Kanagawa (JP); Yasuhiko Suzuki, Miyagi (JP); Motonobu Taketani, Tokyo (JP); Katsuyoshi Shibuya, Kanagawa (JP); Takashi Mizuno, Miyagi (JP); Tsuyoshi Tojo, Miyagi (JP); Shiro Uchida, Tokyo (JP); Masao Ikeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/857,764

(22) Filed: Apr. 5, 2013

(65) Prior Publication Data

US 2013/0230936 A1 Sep. 5, 2013

Related U.S. Application Data

(60) Continuation of application No. 13/080,802, filed on Apr. 6, 2011, now Pat. No. 8,460,958, which is a division of application No. 11/969,088, filed on Jan. 3, 2008, now Pat. No. 7,964,419, which is a division of application No. 10/606,176, filed on Jun. 25, 2003, now Pat. No. 7,339,195, which is a continuation of application No. PCT/JP01/11536, filed on Dec. 27, 2001.

(30) Foreign Application Priority Data

Dec. 28, 2000 (JP) .................................. 2000-401998
Sep. 7, 2001 (JP) .................................. 2001-271947

(51) Int. Cl.
*H01L 33/00* (2010.01)

(52) U.S. Cl.
USPC ............... 257/94; 257/79; 257/102; 257/103; 257/E21.297; 257/E21.352; 438/22; 438/37; 438/46; 438/478; 438/507

(58) Field of Classification Search
USPC .............. 257/79, 94, 101, 102, 103, E21.297, 257/E21.352; 438/22, 37, 46, 478, 507
See application file for complete search history.

(56) References Cited

U.S. PATENT DOCUMENTS

| | | |
|---|---|---|
| 5,670,798 A | 9/1997 | Schetzina |
| 6,031,858 A | 2/2000 | Hatakoshi et al. |

(Continued)

FOREIGN PATENT DOCUMENTS

| | | |
|---|---|---|
| EP | 0 803 916 | 10/1999 |
| JP | 63-046788 | 2/1988 |

(Continued)

OTHER PUBLICATIONS

Shuji Nakamura et al.; Characteristics of InGaN Multi-Quantum-Well-Structure Laser Diodes; Applied Physics Letters, 1996; vol. 68, No. 23, pp. 3269-3271.

(Continued)

*Primary Examiner* — Eduardo A Rodela
(74) *Attorney, Agent, or Firm* — Dentons US LLP

(57) ABSTRACT

A semiconductor light emitting device made of nitride III-V compound semiconductors including an active layer made of a first nitride III-V compound semiconductor containing In and Ga, such as InGaN; an intermediate layer made of a second nitride III-V compound semiconductor containing In and Ga and different from the first nitride III-V compound semiconductor, such as InGaN; and a cap layer made of a third nitride III-V compound semiconductor containing Al and Ga, such as p-type AlGaN, which are deposited in sequential contact.

5 Claims, 16 Drawing Sheets

(56) References Cited

U.S. PATENT DOCUMENTS

| | | | |
|---|---|---|---|
| 6,060,335 | A | 5/2000 | Rennie |
| 6,232,137 | B1 * | 5/2001 | Sugawara et al. ............... 438/46 |
| 6,309,459 | B1 | 10/2001 | Yuge |
| 6,365,923 | B1 | 4/2002 | Kamei |
| 6,515,313 | B1 | 2/2003 | Ibbetson |
| 6,590,234 | B2 | 7/2003 | Kim et al. |
| 7,015,153 | B1 | 3/2006 | Triyoso et al. |
| 7,098,064 | B2 | 8/2006 | Hirukawa |
| 7,964,419 | B2 | 6/2011 | Goto et al. |
| 2001/0004112 | A1 | 6/2001 | Furukawa et al. |

FOREIGN PATENT DOCUMENTS

| | | |
|---|---|---|
| JP | 06-104525 | 4/1994 |
| JP | 09-266326 | 10/1997 |
| JP | 10-144612 | 5/1998 |
| JP | 11-54794 | 2/1999 |
| JP | 11-243251 | 9/1999 |
| JP | 2000-091708 | 3/2000 |
| JP | 2000-101139 | 4/2000 |
| JP | 2000-151023 | 5/2000 |
| JP | 2000-183460 | 6/2000 |
| JP | 2000-208814 | 7/2000 |
| JP | 2000-208875 | 7/2000 |
| JP | 2000-307193 | 11/2000 |
| JP | 2000-349398 | 12/2000 |
| JP | 2001-094216 | 4/2001 |
| JP | 2001-102623 | 4/2001 |
| JP | 2001-196697 | 7/2001 |
| JP | 2001-203384 | 7/2001 |

OTHER PUBLICATIONS

Shuji Nakamura et al.; InGaN Multi-Quantum-Well-Structure Laser Diodes with Cleaved Mirror Cavity Facets; Jpn. J. Appl. Phys; vol. 35; 1996; pp. L217-L220.

Shuji Nakamura; Blue InGaN-Based Laser Diodes with an Emission Wavelength of 450nm; Appl. Phys. Lett.; vol. 76; 2000; pp. 22-24.

Shuji Nakamura et al.; Fist III-V-Nitride-Based Violet Laser Diodes; J. Crystal Growth; vol. 170; 1997; pp. 11-15.

Shuji Nakamura et al.; High-Power, Long-Lifetime InGaN/GaN/AlGaN-Based Laser Diodes Grown on Pure GaN Substrates; Jpn. J. Appl. Phys., vol. 35, 1998, pp. L309-L312.

Shuji Nakamura; InGaN/GaN/AlGaN-Based Laser Diodes Grown on Epitaxially Laterally Overgrown GaN; J. Mater. Res.; vol. 14, No. 7; 1999; pp. 2716-2731.

Shuji Nakamura et al.; InGaN/GaN/AlGaN-Based Laser Diodes with Modulation-Doped Strained-Layer Superlattices; Jpn. J. Appl. Phys.; vol. 36; 1997; pp. 1568-1571.

Japanese Office Action issued on Dec. 6, 2011 in connection with counterpart JP Application No. 2006-303673.

Japanese Office Action issued on Jun. 19, 2012, in connection with counterpart JP Application No. 2010-157512.

Japanese Office Action for Japanese counterpart application No. JP 2010-157512 dated Dec. 18, 2012.

Japanese Office Action for Japanese counterpart application No. JP 2010-157512 dated Mar. 12, 2013.

Japanese Supplemental Office Action for Japanese counterpart application No. JP 2010-157512 dated Mar. 12, 2013.

Japanese Office Action issued in related Japanese counterpart JP application No. 2010-157512 dated Mar. 12, 2013.

* cited by examiner

SEMICONDUCTOR LIGHT EMITTING DEVICE, ITS MANUFACTURING METHOD, SEMICONDUCTOR DEVICE AND ITS MANUFACTURING METHOD

RELATED APPLICATION DATA

This application is a continuation of U.S. application Ser. No. 13/080,02, filed Apr. 6, 2011, which is a division of U.S. application Ser. No. 11/969,088, filed Jan. 3, 2008, issued on Jun. 21, 2011 as U.S. Pat. No. 7,964,419, which is a division of U.S. application Ser. No. 10/606,176, filed on Jun. 25, 2003, issued on Mar. 4, 2008 as U.S. Pat. No. 7,339,195, which is a continuation of PCT Application No. PCT/JP2001/11536 filed Dec. 27, 2001, which claims priority to Japanese applications Nos. P2000-401998 filed Dec. 28, 2000, and P2001-271947 filed Sep. 7, 2001, all of which are incorporated herein by reference to the extent permitted by law.

BACKGROUND OF THE INVENTION

This invention relates to a semiconductor light emitting device and a manufacturing method thereof, as well as a semiconductor device and a manufacturing method thereof, especially suitable for applications to semiconductor lasers, light emitting diodes or electron transporting devices made by using nitride III-V compound semiconductors.

Semiconductor lasers made of AlGaInN or other nitride III-V compound semiconductors are under active researches and developments as semiconductor lasers capable of emitting light from the blue region to the ultraviolet region required for enhancing the density of optical discs.

Japanese Patents No. 2780691 and 2735057 disclose semiconductor lasers using nitride III-V compound semiconductors. A semiconductor laser disclosed by the former patent is made of nitride semiconductors containing In and Ga, and includes an active layer of a quantum well structure having first and second surfaces, an n-type nitride semiconductor layer made of $In_xGa_{1-x}N$ ($0 \leq x < 1$) in contact with the first surface of the active layer, and a p-type nitride semiconductor layer made of $Al_yGa_{1-y}N$ ($0<y<1$) in contact with the second surface of the active layer. A semiconductor laser disclosed by the latter patent is made of nitride semiconductors containing In and Ga, and includes an active layer having first and second surfaces, a p-type contact layer made of p-type GaN adjacent the second surface of the active layer, and a first p-type clad layer made of a p-type nitride semiconductor containing In and Ga between the second surface of the active layer and the p-type contact layer and having a band gap energy larger than that of the active layer such that the first p-type clad layer is in direct contact with the second surface of the active layer.

When the Inventor actually fabricated a semiconductor laser using the technique disclosed by the former Japanese Patent No. 2780691 for the research purposes, the laser exhibited a high initial deterioration rate in its life test and a tendency of gradually increasing in operation current with time. Additionally, remarkably uneven electroluminescent emission of light was observed.

A semiconductor laser experimentally fabricated by using the technique disclosed by the latter Japanese Patent No. 2735057 exhibited a still remarkable increase of the initial deterioration rate.

It is therefore an object of the invention to provide a semiconductor device made of nitride III-V compound semiconductors, having a sufficiently low initial deterioration rate and a long lifetime, and remarkably reduced in change with time of the operation current and in emission unevenness, as well as a method capable of easily manufacturing such a semiconductor light emitting device.

More generally, an object of the invention is to provide a semiconductor device made of nitride III-V compound semiconductors, elongated in lifetime and remarkably reduced in change with time, as well as a method capable of easily manufacturing such a semiconductor device.

A further object of the invention is to provide a semiconductor light emitting device made of nitride III-V compound semiconductors, elongated in lifetime by improvement of the crystalline quality of its optical waveguide layer, additionally exhibiting high symmetry of intensity distribution of light in far-field images especially in case of a semiconductor laser, and capable of reducing the aspect ratio of the radiation angle (beam divergence angle), as well as a method capable of easily manufacturing such a semiconductor light emitting device.

More generally, the further object of the invention is to provide a semiconductor device made of nitride III-V compound semiconductors, elongated in lifetime and having favorable properties, as well as a method capable of easily manufacturing such a semiconductor device.

SUMMARY OF THE INVENTION

To solve the above-discussed problems, the Inventor made researches with all efforts. Outline thereof is explained below.

For manufacturing a semiconductor laser using nitride III-V compound semiconductors, in general, for the purpose of preventing deterioration of its active layer by elimination of In or preventing overflow of electrons injected into the active layer in the process of growing a p-type optical guide layer or a p-type clad layer on the active layer of InGaN, or the like, at a high growth temperature around 1000° C., the active layer is first grown, then an approximately 20 nm thick cap layer of p-type AlGaN having Al composition as high as approximately 0.2 is next grown at the same temperature as the active layer, and a p-type optical guide layer ad a p-type clad layer are grown at a raised growth temperature. However, according to the knowledge of the Inventor, although this structure certainly prevents deterioration of the active layer by elimination of In, a large difference in lattice constant between the cap layer and the active layer causes generation of a large stress in the active layer in contact with the cap layer, and this invites deterioration of the active layer. Furthermore, although Mg is typically used as the p-type dopant of p-type layers, diffusion of Mg from the p-type layers into the active layer also causes deterioration of the active layer.

Through various experiments, the Inventor has found that these problems can be overcome simultaneously by interposing a nitride III-V compound semiconductor layer containing In and Ga, such as InGaN, between the active layer and the cap layer.

After further researches, the Inventor has also found that, in case a nitride III-V compound semiconductor containing In, such as InGaN, is grown while the flow rate of In source material is maintained in the same level after growth of the uppermost barrier layer of the active layer having a multi-quantum well structure, quantity of In can be adequately controlled at the growth temperature. Thus, by using it upon growing such a nitride III-V compound semiconductor containing In, such as InGaN, since the growth temperature can be raised during the growth and the cap layer can therefore be grown at a raised growth temperature to improve the crystalline quality, the cap layer can be reduced in thickness or can be even omitted in the ultimate case exclusively from the viewpoint of preventing elimination of In from the active layer.

On the other hand, as to the position where the cap layer should be located in the laser structure, namely between the active layer and the p-type clad layer, there still remains room for improvement. Under the situation, the Inventor made efforts to optimize the position of the cap layer while taking account of assuring design choice, and has found some optimum positions from the viewpoints of improving the crystalline quality of the optical guide layer and improving symmetry of intensity distribution of light in far-field images. Furthermore, the Inventor has found various advantages when the aforementioned nitride III-V compound semiconductor layer containing In and Ga, such as InGaN, is provided in contact with the active layer in addition to optimizing the position of the cap layer.

Although these expedients were confirmed to be effective in semiconductor lasers, they must be effective for all semiconductor devices including light emitting diodes and electron transporting devices such as transistors as far as they have similar layer structures.

The present invention has been accomplished as a result of further researches progressed by the Inventor from the above-explained knowledge.

That is, according to the first of the invention to solve the above-indicated issues, there is provided a semiconductor light emitting device comprising:

an active layer made of a first nitride III-V compound semiconductor containing In and Ga;

an intermediate layer in contact with the active layer and made of a second nitride III-V compound semiconductor containing In and Ga and different from the first nitride III-V compound semiconductor; and a cap layer in contact with the intermediate layer and made of a third nitride III-V compound semiconductor containing Al and Ga.

According to the second aspect of the invention, there is provided a semiconductor light emitting device comprising:

an active layer made of a first nitride III-V compound semiconductor containing In and Ga;

an intermediate layer in contact with the active layer and made of a second nitride III-V compound semiconductor containing In and Ga and different from the first nitride III-V compound semiconductor; and a cap layer in contact with the intermediate layer and made of a fifth nitride III-V compound semiconductor containing Ga to be used as an optical guide layer or a clad layer.

According to the third aspect of the invention, there is provided a manufacturing method of a semiconductor light emitting device including an active layer made of a first nitride III-V compound semiconductor containing In and Ga; an intermediate layer in contact with the active layer and made of a second nitride III-V compound semiconductor containing In and Ga and different from the first nitride III-V compound semiconductor; and a cap layer in contact with the intermediate layer and made of a third nitride III-V compound semiconductor containing Al and Ga, comprising:

growing the intermediate layer while raising the growth temperature after growing the active layer.

According to the fourth aspect of the invention, there is provided a manufacturing method of a semiconductor light emitting device including an active layer made of a first nitride III-V compound semiconductor containing In and Ga; an intermediate layer in contact with the active layer and made of a second nitride III-V compound semiconductor containing In and Ga and different from the first nitride III-V compound semiconductor; and a cap layer in contact with the intermediate layer and made of a fifth nitride III-V compound semiconductor containing Ga to be used as an optical guide layer or a clad layer, comprising:

growing the intermediate layer while raising the growth temperature after growing the active layer.

According to the fifth aspect of the invention, there is provided a semiconductor device comprising:

a layer made of a first nitride III-V compound semiconductor containing In and Ga;

an intermediate layer in contact with the layer made of the first nitride III-V compound semiconductor, and made of a second nitride III-V compound semiconductor containing In and Ga and different from the first nitride III-V compound semiconductor; and a cap layer in contact with the intermediate layer and made of a third nitride III-V compound semiconductor containing Al and Ga.

According to the sixth aspect of the invention, there is provided a semiconductor device comprising:

a layer made of a first nitride III-V compound semiconductor containing In and Ga;

an intermediate layer in contact with the layer made of the first nitride III-V compound semiconductor, and made of a second nitride III-V compound semiconductor containing In and Ga and different from the first nitride III-V compound semiconductor; and a p-type layer in contact with the intermediate layer and made of a third nitride III-V compound semiconductor containing Al and Ga.

According to the seventh aspect of the invention, there is provided a manufacturing method of a semiconductor device including a layer made of a first nitride III-V compound semiconductor containing In and Ga; an intermediate layer in contact with the layer made of the first nitride III-V compound semiconductor, and made of a second nitride III-V compound semiconductor containing In and Ga and different from the first nitride III-V compound semiconductor; and a cap layer in contact with the intermediate layer and made of a third nitride III-V compound semiconductor containing Al and Ga, comprising:

growing the intermediate layer while raising the growth temperature after growing the layer made of the first nitride III-V compound semiconductor.

According to the eighth aspect of the invention, there is provided a manufacturing method of a semiconductor device including a layer made of a first nitride III-V compound semiconductor containing In and Ga; an intermediate layer in contact with the layer made of the first nitride III-V compound semiconductor, and made of a second nitride III-V compound semiconductor containing In and Ga and different from the first nitride III-V compound semiconductor; and a p-type layer in contact with the intermediate layer and made of a third nitride III-V compound semiconductor containing Al and Ga, comprising:

growing the intermediate layer while raising the growth temperature after growing the layer made of the first nitride III-V compound semiconductor.

In the present invention, the first nitride III-V compound semiconductor containing In and Ga as well as the second nitride III-V compound semiconductor may additionally contain Al or B, for example, as a group III element other than In and Ga, and may contain As or P as a group V element. The third nitride III-V compound semiconductor containing Al and Ga may contain In or B, for example, as a group III element other than Al and Ga, and may contain As or P as a group V element. The fourth nitride III-V compound semiconductor containing Ga as well as the fifth nitride III-V compound semiconductor may contain In, Al or B, for example, as a group III other than Ga, and may contain As or P, for example, as a group V element.

The second nitride III-V compound semiconductor composing the intermediate layer is typically $In_xGa_{1-x}N$ (where $0 \leq x < 1$). The intermediate layer is typically undoped, and normally of an n-type. The third III-V compound semiconductor composing the cap layer is typically $Al_yGa_{1-y}N$ (where $0 \leq y < 1$). Thickness of the cap layer is preferably equal to or more than 2 nm to ensure a sufficient effect by the use of the cap layer. However, if the cap layer is excessively thick, the crystalline quality deteriorates in some kinds of composition. To prevent it, thickness of the cap layer is preferably limited not to exceed 10 nm. When the device includes the p-type layer in contact with the cap layer and made of the fourth nitride III-V compound semiconductor, the fourth III-V compound semiconductor composing the p-type layer may be, for example, GaN or $In_zGa_{1-z}N$ (where $0 \leq z < 1$).

The active layer made of the first nitride III-V compound semiconductor, or the layer made of the first nitride III-V compound semiconductor, typically has a multi-quantum well structure including well layers and barrier layers. In this case, composition of In in the intermediate layer is equal to or smaller than the In composition of the barrier layers. Various kinds of distribution of the In composition are acceptable. If the intermediate layer is grown while the growth temperature is gradually raised, the intermediate layer can be formed to gradually decrease in composition of In toward its portion remotest from the active layer or the layer made of the first nitride III-V compound semiconductor. Quantity of In contained in the intermediate layer is typically equal to or less than $5 \times 10^{19}$ cm$^{-3}$. Thickness of the intermediate layer is determined such that the intermediate layer can effectively prevent deterioration of the active layer or the layer made of the first nitride III-V compound semiconductor, in accordance with its composition selected. Typically, the thickness is controlled to be equal to or more than 8 nm, and preferably to be equal to or more than 10 nm.

The p-type layer composed of the fourth nitride III-V compound semiconductor typically contains a quantity of In controlled in the range not less than $1 \times 10^{17}$ cm$^{-3}$ and not more than $5 \times 10^{19}$ cm$^{-3}$.

Any of various kinds of substrates may be used to grow the nitride III-V compound semiconductors thereon. For example, a sapphire substrate, SiC substrate, Si substrate, GaAs substrate, GaP substrate, GaP substrate, InP substrate, spinel substrate or silicon oxide substrate may be used. A substrate in form of a thick GaN layer or other nitride III-V compound semiconductor can be used as well.

For growth of the nitride III-V compound semiconductors, any appropriate technique such as metal organic chemical vapor deposition (MOCVD), hydride vapor phase epitaxial growth or halide vapor phase epitaxial growth (HVPE), for example, may be used.

The semiconductor device may be a light emitting device such as a semiconductor laser or a light emitting diode, or an electron transporting device such as FET or a heterojunction bipolar transistor.

According to the ninth aspect of the invention, there is provided a semiconductor light emitting device comprising:

an active layer made of a first nitride III-V compound semiconductor containing In and Ga;

an optical guide layer in contact with the active layer and made of a sixth nitride III-V compound semiconductor containing Ga;

a cap layer in contact with the intermediate layer and made of a third nitride III-V compound semiconductor containing Al and Ga; and a p-type clad layer in contact with the cap layer and made of a seventh nitride III-V compound semiconductor containing Al and Ga and different from the third nitride III-V compound semiconductor.

According to the 10th aspect of the invention, there is provided a semiconductor light emitting device comprising:

an active layer made of a first nitride III-V compound semiconductor containing In and Ga;

an intermediate layer in contact with the active layer and made of a second nitride III-V compound semiconductor containing In and Ga and different from the first nitride III-V compound semiconductor;

an optical guide layer in contact with the intermediate layer and made of a sixth nitride III-V compound semiconductor containing Ga;

a cap layer in contact with the optical guide layer and made of a third nitride III-V compound semiconductor containing Al and Ga; and a p-type clad layer in contact with the cap layer and made of a seventh nitride III-V compound semiconductor containing Al and Ga and different from the third nitride III-V compound semiconductor.

According to the 11th aspect of the invention, there is provided a semiconductor light emitting device comprising:

an active layer made of a first nitride III-V compound semiconductor containing In and Ga;

a first optical guide layer in contact with the active layer and made of an eighth nitride III-V compound semiconductor containing Ga;

a cap layer in contact with the first optical guide layer and made of a third nitride III-V compound semiconductor containing Al and Ga;

a second optical guide layer in contact with the cap layer and made of a ninth nitride III-V compound semiconductor containing Ga; and a p-type clad layer in contact with the cap layer and made of a seventh nitride III-V compound semiconductor containing Al and Ga and different from the third nitride III-V compound semiconductor.

According to the 12th aspect of the invention, there is provided a semiconductor light emitting device comprising:

an active layer made of a first nitride III-V compound semiconductor containing In and Ga;

an intermediate layer in contact with the active layer and made of a second nitride III-V compound semiconductor containing In and Ga and different from the first nitride III-V compound semiconductor;

a first optical guide layer in contact with the intermediate layer and made of an eighth nitride III-V compound semiconductor containing Ga;

a cap layer in contact with the first optical guide layer and made of a third nitride III-V compound semiconductor containing Al and Ga;

a second optical guide layer in contact with the cap layer and made of a ninth nitride III-V compound semiconductor containing Ga; and a p-type clad layer in contact with the cap layer and made of a seventh nitride III-V compound semiconductor containing Al and Ga and different from the third nitride III-V compound semiconductor.

According to the 13th aspect of the invention, there is provided a semiconductor light emitting device comprising:

an active layer made of a first nitride III-V compound semiconductor containing In and Ga;

a first optical guide layer in contact with the active layer and made of an eighth nitride III-V compound semiconductor containing Ga;

a cap layer in contact with the first optical guide layer and having a superlattice structure in which barrier layers are made of a third nitride III-V compound semiconductor containing Al and Ga;

a second optical guide layer in contact with the cap layer and made of a ninth nitride III-V compound semiconductor containing Ga; and a p-type clad layer in contact with the cap layer and made of a seventh nitride III-V compound semiconductor containing Al and Ga and different from the third nitride III-V compound semiconductor.

According to the 14th aspect of the invention, there is provided a semiconductor light emitting device comprising:

an active layer made of a first nitride III-V compound semiconductor containing In and Ga;

an intermediate layer in contact with the active layer and made of a second nitride III-V compound semiconductor containing In and Ga and different from the first nitride III-V compound semiconductor;

a first optical guide layer in contact with the intermediate layer and made of an eighth nitride III-V compound semiconductor containing Ga;

a cap layer in contact with the first optical guide layer and having a superlattice structure in which barrier layers are made of a third nitride III-V compound semiconductor containing Al and Ga;

a second optical guide layer in contact with the cap layer and made of a ninth nitride III-V compound semiconductor containing Ga; and a p-type clad layer in contact with the cap layer and made of a seventh nitride III-V compound semiconductor containing Al and Ga and different from the third nitride III-V compound semiconductor.

According to the 15th aspect of the invention, there is provided a semiconductor light emitting device comprising:

an active layer made of a first nitride III-V compound semiconductor containing In and Ga;

an optical guide layer in contact with the active layer and made of a sixth nitride III-V compound semiconductor containing Ga;

a cap layer in contact with the optical guide layer and having a superlattice structure in which barrier layers are made of a third nitride III-V compound semiconductor containing Al and Ga; and a p-type clad layer in contact with the cap layer and made of a seventh nitride III-V compound semiconductor containing Al and Ga and different from the third nitride III-V compound semiconductor.

According to the 16th aspect of the invention, there is provided a semiconductor light emitting device comprising:

an active layer made of a first nitride III-V compound semiconductor containing In and Ga;

an intermediate layer in contact with the active layer and made of a second nitride III-V compound semiconductor containing In and Ga and different from the first nitride III-V compound semiconductor;

an optical guide layer in contact with the intermediate layer and made of a sixth nitride III-V compound semiconductor containing Ga;

a cap layer in contact with the optical guide layer and having a superlattice structure in which barrier layers are made of the third nitride III-V compound semiconductor containing Al and Ga; and a p-type clad layer in contact with the cap layer and made of a seventh nitride III-V compound semiconductor containing Al and Ga and different from the third nitride III-V compound semiconductor.

According to the 17th aspect of the invention, there is provided a manufacturing method of a semiconductor light emitting device including an active layer made of a first nitride III-V compound semiconductor containing In and Ga; an optical guide layer in contact with the active layer and made of a sixth nitride III-V compound semiconductor containing Ga; a cap layer in contact with the optical guide layer and made of a third nitride III-V compound semiconductor containing Al and Ga; and a p-type clad layer in contact with the cap layer and made of a seventh nitride III-V compound semiconductor containing Al and Ga and different from the third nitride III-V compound semiconductor, comprising:

growing the active layer, the optical guide layer and the cap layer in a carrier gas atmosphere containing substantially no hydrogen and containing nitrogen as the major component thereof; and growing the p-type clad layer in a carrier gas atmosphere containing nitrogen and hydrogen as major components thereof.

According to the 18th aspect of the invention, there is provided a manufacturing method of a semiconductor light emitting device including an active layer made of a first nitride III-V compound semiconductor containing In and Ga; an optical guide layer in contact with the active layer and made of a sixth nitride III-V compound semiconductor containing Ga; a cap layer in contact with the optical guide layer and made of a third nitride III-V compound semiconductor containing Al and Ga; and a p-type clad layer in contact with the cap layer and made of a seventh nitride III-V compound semiconductor containing Al and Ga and different from the third nitride III-V compound semiconductor, comprising:

growing the active layer, the optical guide layer and the cap layer at a growth temperature lower than the growth temperature of the p-type clad layer.

According to the 19th aspect of the invention, there is provided a manufacturing method of a semiconductor light emitting device including an active layer made of a first nitride III-V compound semiconductor containing In and Ga; an intermediate layer in contact with the active layer and made of a second nitride III-V compound semiconductor containing In and Ga and different from the first nitride III-V compound semiconductor; an optical guide layer in contact with the intermediate layer and made of a sixth nitride III-V compound semiconductor containing Ga; a cap layer in contact with the optical guide layer and made of a third nitride III-V compound semiconductor containing Al and Ga; and a p-type clad layer in contact with the cap layer and made of a seventh nitride III-V compound semiconductor containing Al and Ga and different from the third nitride III-V compound semiconductor, comprising:

growing the active layer, the intermediate layer, the optical guide layer and the cap layer in a carrier gas atmosphere containing substantially no hydrogen and containing nitrogen as the major component thereof; and growing the p-type clad layer in a carrier gas atmosphere containing nitrogen and hydrogen as major components thereof.

According to the 20th aspect of the invention, there is provided a manufacturing method of a semiconductor light emitting device including an active layer made of a first nitride III-V compound semiconductor containing In and Ga; an intermediate layer in contact with the active layer and made of a second nitride III-V compound semiconductor containing In and Ga and different from the first nitride III-V compound semiconductor; an optical guide layer in contact with the intermediate layer and made of a sixth nitride III-V compound semiconductor containing Ga; a cap layer in contact with the optical guide layer and made of a third nitride III-V compound semiconductor containing Al and Ga; and a p-type clad layer in contact with the cap layer and made of a seventh nitride III-V compound semiconductor containing Al and Ga and different from the third nitride III-V compound semiconductor, comprising:

growing the active layer, the intermediate layer, the optical guide layer and the cap layer at a growth temperature lower than the growth temperature of the p-type clad layer.

Typically, the active layer and the intermediate layer are grown under a growth temperature lower than that of the optical guide layer and the cap layer.

According to the 21st aspect of the invention, there is provided a manufacturing method of a semiconductor light emitting device including an active layer made of a first nitride III-V compound semiconductor containing In and Ga; a first optical guide layer in contact with the active layer and made of an eighth nitride III-V compound semiconductor containing Ga; a cap layer in contact with the first optical guide layer and made of a third nitride III-V compound semiconductor containing Al and Ga; a second optical guide layer in contact with the cap layer and made of a ninth nitride III-V compound semiconductor containing Ga; and a p-type clad layer in contact with the second optical guide layer and made of a seventh nitride III-V compound semiconductor containing Al and Ga and different from the third nitride III-V compound semiconductor, comprising:

growing the active layer, the first optical guide layer and the cap layer in a carrier gas atmosphere containing substantially no hydrogen and containing nitrogen as the major component thereof; and growing the second optical guide layer and the p-type clad layer in a carrier gas atmosphere containing nitrogen and hydrogen as major components thereof.

According to the 22nd aspect of the invention, there is provided a manufacturing method of a semiconductor light emitting device including an active layer made of a first nitride III-V compound semiconductor containing In and Ga; a first optical guide layer in contact with the active layer and made of an eighth nitride III-V compound semiconductor containing Ga; a cap layer in contact with the first optical guide layer and made of a third nitride III-V compound semiconductor containing Al and Ga; a second optical guide layer in contact with the cap layer and made of a ninth nitride III-V compound semiconductor containing Ga; and a p-type clad layer in contact with the second optical guide layer and made of a seventh nitride III-V compound semiconductor containing Al and Ga and different from the third nitride III-V compound semiconductor, comprising:

growing the active layer, the first optical guide layer and the cap layer at a growth temperature lower than the growth temperature of the second optical guide layer and the p-type clad layer.

According to the 23rd aspect of the invention, there is provided a manufacturing method of a semiconductor light emitting device including an active layer made of a first nitride III-V compound semiconductor containing In and Ga; an intermediate layer in contact with the active layer and made of a second nitride III-V compound semiconductor containing In and Ga and different from the first nitride III-V compound semiconductor; a first optical guide layer in contact with the intermediate layer and made of an eighth nitride III-V compound semiconductor containing Ga; a cap layer in contact with the first optical guide layer and made of a third nitride III-V compound semiconductor containing Al and Ga; a second optical guide layer in contact with the cap layer and made of a ninth nitride III-V compound semiconductor containing Ga; and a p-type clad layer in contact with the second optical guide layer and made of a seventh nitride III-V compound semiconductor containing Al and Ga and different from the third nitride III-V compound semiconductor, comprising:

growing the active layer, the intermediate layer, the first optical guide layer and the cap layer in a carrier gas atmosphere containing substantially no hydrogen and containing nitrogen as the major component thereof; and growing the second optical guide layer and the p-type clad layer in a carrier gas atmosphere containing nitrogen and hydrogen as major components thereof.

According to the 24th aspect of the invention, there is provided a manufacturing method of a semiconductor light emitting device including an active layer made of a first nitride III-V compound semiconductor containing In and Ga; an intermediate layer in contact with the active layer and made of a second nitride III-V compound semiconductor containing In and Ga and different from the first nitride III-V compound semiconductor; a first optical guide layer in contact with the intermediate layer and made of an eighth nitride III-V compound semiconductor containing Ga; a cap layer in contact with the first optical guide layer and made of a third nitride III-V compound semiconductor containing Al and Ga; a second optical guide layer in contact with the cap layer and made of a ninth nitride III-V compound semiconductor containing Ga; and a p-type clad layer in contact with the second optical guide layer and made of a seventh nitride III-V compound semiconductor containing Al and Ga and different from the third nitride III-V compound semiconductor, comprising:

growing the active layer, the intermediate layer, the first optical guide layer and the cap layer at a growth temperature lower than the growth temperature of the second optical guide layer and the p-type clad layer.

Typically, the active layer is grown under a growth temperature lower than that of intermediate layer, first optical guide layer and cap layer.

According to the 25th aspect of the invention, there is provided a manufacturing method of a semiconductor light emitting device including an active layer made of a first nitride III-V compound semiconductor containing In and Ga; a first optical guide layer in contact with the active layer and made of an eighth nitride III-V compound semiconductor containing Ga; a cap layer in contact with the first optical guide layer and having a superlattice structure in which barrier layers are made of a third nitride III-V compound semiconductor containing Al and Ga; a second optical guide layer in contact with the cap layer and made of a ninth nitride III-V compound semiconductor containing Ga; and a p-type clad layer in contact with the second optical guide layer and made of a seventh nitride III-V compound semiconductor containing Al and Ga and different from the third nitride III-V compound semiconductor, comprising:

growing the active layer, the first optical guide layer and the cap layer in a carrier gas atmosphere containing substantially no hydrogen and containing nitrogen as the major component thereof; and growing the second optical guide layer and the p-type clad layer in a carrier gas atmosphere containing nitrogen and hydrogen as major components thereof.

According to the 26th aspect of the invention, there is provided a manufacturing method of a semiconductor light emitting device including an active layer made of a first nitride III-V compound semiconductor containing In and Ga; a first optical guide layer in contact with the active layer and made of an eighth nitride III-V compound semiconductor containing Ga; a cap layer in contact with the first optical guide layer and having a superlattice structure in which barrier layers are made of a third nitride III-V compound semiconductor containing Al and Ga; a second optical guide layer in contact with the cap layer and made of a ninth nitride III-V compound semiconductor containing Ga; and a p-type clad layer in contact with the second optical guide layer and made of a seventh nitride III-V compound semiconductor containing Al and Ga and different from the third nitride III-V compound semiconductor, comprising:

growing the active layer, the first optical guide layer and the cap layer at a growth temperature lower than the growth temperature of the second optical guide layer and the p-type clad layer.

According to the 27th aspect of the invention, there is provided a manufacturing method of a semiconductor light emitting device including an active layer made of a first nitride III-V compound semiconductor containing In and Ga; an intermediate layer in contact with the active layer and made of a second nitride III-V compound semiconductor containing In and Ga and different from the first nitride III-V compound semiconductor; a first optical guide layer in contact with the intermediate layer and made of an eighth nitride III-V compound semiconductor containing Ga; a cap layer in contact with the first optical guide layer and having a superlattice structure in which barrier layers are made of a third nitride III-V compound semiconductor containing Al and Ga; a second optical guide layer in contact with the cap layer and made of a ninth nitride III-V compound semiconductor containing Ga; and a p-type clad layer in contact with the second optical guide layer and made of a seventh nitride III-V compound semiconductor containing Al and Ga and different from the third nitride III-V compound semiconductor, comprising:

growing the active layer, the intermediate layer, the first optical guide layer and the cap layer in a carrier gas atmosphere containing substantially no hydrogen and containing nitrogen as the major component thereof; and growing the second optical guide layer and the p-type clad layer in a carrier gas atmosphere containing nitrogen and hydrogen as major components thereof.

According to the 28th aspect of the invention, there is provided a manufacturing method of a semiconductor light emitting device including an active layer made of a first nitride III-V compound semiconductor containing In and Ga; an intermediate layer in contact with the active layer and made of a second nitride III-V compound semiconductor containing In and Ga and different from the first nitride III-V compound semiconductor; a first optical guide layer in contact with the intermediate layer and made of an eighth nitride III-V compound semiconductor containing Ga; a cap layer in contact with the first optical guide layer and having a superlattice structure in which barrier layers are made of a third nitride III-V compound semiconductor containing Al and Ga; a second optical guide layer in contact with the cap layer and made of a ninth nitride III-V compound semiconductor containing Ga; and a p-type clad layer in contact with the second optical guide layer and made of a seventh nitride III-V compound semiconductor containing Al and Ga and different from the third nitride III-V compound semiconductor, comprising:

growing the active layer, the intermediate layer, the first optical guide layer and the cap layer at a growth temperature lower than the growth temperature of the second optical guide layer and the p-type clad layer.

Typically, the active layer and the intermediate layer are grown under a growth temperature lower than that of the optical guide layer and the cap layer.

According to the 29th aspect of the invention, there is provided a manufacturing method of a semiconductor light emitting device including an active layer made of a first nitride III-V compound semiconductor containing In and Ga; an optical guide layer in contact with the active layer and made of a sixth nitride III-V compound semiconductor containing Ga; a cap layer in contact with the optical guide layer and having a superlattice structure in which barrier layers are made of a third nitride III-V compound semiconductor containing Al and Ga; and a p-type clad layer in contact with the cap layer and made of a seventh nitride III-V compound semiconductor containing Al and Ga and different from the third nitride III-V compound semiconductor, comprising:

growing the active layer, the optical guide layer and the cap layer in a carrier gas atmosphere containing substantially no hydrogen and containing nitrogen as the major component thereof; and growing the p-type clad layer in a carrier gas atmosphere containing nitrogen and hydrogen as major components thereof.

According to the 30th aspect of the invention, there is provided a manufacturing method of a semiconductor light emitting device including an active layer made of a first nitride III-V compound semiconductor containing In and Ga; an optical guide layer in contact with the active layer and made of a sixth nitride III-V compound semiconductor containing Ga; a cap layer in contact with the optical guide layer and having a superlattice structure in which barrier layers are made of a third nitride III-V compound semiconductor containing Al and Ga; and a p-type clad layer in contact with the cap layer and made of a seventh nitride III-V compound semiconductor containing Al and Ga and different from the third nitride III-V compound semiconductor, comprising:

growing the active layer, the optical guide layer and the cap layer at a growth temperature lower than the growth temperature of the p-type clad layer.

According to the 31st aspect of the invention, there is provided a manufacturing method of a semiconductor light emitting device including an active layer made of a first nitride III-V compound semiconductor containing In and Ga; an intermediate layer in contact with the active layer and made of a second nitride III-V compound semiconductor containing In and Ga and different from the first nitride III-V compound semiconductor; an optical guide layer in contact with the intermediate layer and made of a sixth nitride III-V compound semiconductor containing Ga; a cap layer in contact with the optical guide layer and having a superlattice structure in which barrier layers are made of the third nitride III-V compound semiconductor containing Al and Ga; and a p-type clad layer in contact with the cap layer and made of a seventh nitride III-V compound semiconductor containing Al and Ga and different from the third nitride III-V compound semiconductor, comprising:

growing the active layer, the intermediate layer, the optical guide layer and the cap layer in a carrier gas atmosphere containing substantially no hydrogen and containing nitrogen as the major component thereof; and growing the p-type clad layer in a carrier gas atmosphere containing nitrogen and hydrogen as major components thereof.

According to the 32nd aspect of the invention, there is provided a manufacturing method of a semiconductor light emitting device including an active layer made of a first nitride III-V compound semiconductor containing In and Ga; an intermediate layer in contact with the active layer and made of a second nitride III-V compound semiconductor containing In and Ga and different from the first nitride III-V compound semiconductor; an optical guide layer in contact with the intermediate layer and made of a sixth nitride III-V compound semiconductor containing Ga; a cap layer in contact with the optical guide layer and having a superlattice structure in which barrier layers are made of the third nitride III-V compound semiconductor containing Al and Ga; and a p-type clad layer in contact with the cap layer and made of a seventh nitride III-V compound semiconductor containing Al and Ga and different from the third nitride III-V compound semiconductor, comprising:

growing the active layer, the intermediate layer, the optical guide layer and the cap layer at a growth temperature lower than the growth temperature of the p-type clad layer.

Typically, the active layer and the intermediate layer are grown under a growth temperature lower than that of the optical guide layer and the cap layer.

According to the 33rd aspect of the invention, there is provided a semiconductor device comprising:

a layer made of a first nitride III-V compound semiconductor containing In and Ga;

a layer in contact with the layer made of the first nitride III-V compound semiconductor, and made of a sixth nitride III-V compound semiconductor containing Ga;

a cap layer in contact with the layer made of the sixth nitride III-V compound semiconductor, and made of a third nitride III-V compound semiconductor containing Al and Ga; and a p-type layer in contact with the cap layer and made of a seventh nitride III-V compound semiconductor containing Al and Ga and different from the third nitride III-V compound semiconductor.

According to the 34th aspect of the invention, there is provided a semiconductor device comprising:

a layer made of a first nitride III-V compound semiconductor containing In and Ga;

an intermediate layer in contact with the layer made of the first nitride III-V compound semiconductor, and made of a second nitride III-V compound semiconductor containing In and Ga and different from the first nitride III-V compound semiconductor;

a layer in contact with the intermediate layer and made of a sixth nitride III-V compound semiconductor containing Ga;

a cap layer in contact with the layer made of the sixth nitride III-V compound semiconductor, and made of a third nitride III-V compound semiconductor containing Al and Ga; and a p-type layer in contact with the cap layer and made of a seventh nitride III-V compound semiconductor containing Al and Ga and different from the third nitride III-V compound semiconductor.

According to the 35th aspect of the invention, there is provided a semiconductor device comprising:

a layer made of a first nitride III-V compound semiconductor containing In and Ga;

a layer in contact with the layer made of the first nitride III-V compound semiconductor, and made of an eighth nitride III-V compound semiconductor containing Ga;

a cap layer in contact with the layer made of the eighth nitride III-V compound semiconductor, and made of a third nitride III-V compound semiconductor containing Al and Ga;

a layer in contact with the cap layer and made of a ninth nitride III-V compound semiconductor containing Ga; and a p-type layer in contact with the layer made of the ninth nitride III-V compound semiconductor, and made of a seventh nitride III-V compound semiconductor containing Al and Ga and different from the third nitride III-V compound semiconductor.

According to the 36th aspect of the invention, there is provided a semiconductor device comprising:

a layer made of a first nitride III-V compound semiconductor containing In and Ga;

an intermediate layer in contact with the layer made of the first nitride III-V compound semiconductor, and made of a second nitride III-V compound semiconductor containing In and Ga and different from the first nitride III-V compound semiconductor;

a layer in contact with the intermediate layer and made of an eighth nitride III-V compound semiconductor containing Ga;

a cap layer in contact with the layer made of the eighth nitride III-V compound semiconductor, and made of a third nitride III-V compound semiconductor containing Al and Ga;

a layer in contact with the cap layer and made of a ninth nitride III-V compound semiconductor containing Ga; and a p-type layer in contact with the layer made of the ninth nitride III-V compound semiconductor, and made of a seventh nitride III-V compound semiconductor containing Al and Ga and different from the third nitride III-V compound semiconductor.

According to the 37th aspect of the invention, there is provided a semiconductor device comprising:

a layer made of a first nitride III-V compound semiconductor containing In and Ga;

a layer in contact with the layer made of the first nitride III-V compound semiconductor, and made of an eighth nitride III-V compound semiconductor containing Ga;

a cap layer in contact with the layer made of the eighth nitride III-V compound semiconductor, and having a superlattice structure in which barrier layers are made of a third nitride III-V compound semiconductor containing Al and Ga;

a layer in contact with the cap layer and made of a ninth nitride III-V compound semiconductor containing Ga; and a p-type layer in contact with the layer made of the ninth nitride III-V compound semiconductor, and made of a seventh nitride III-V compound semiconductor containing Al and Ga and different from the third nitride III-V compound semiconductor.

According to the 38th aspect of the invention, there is provided a semiconductor device comprising:

a layer made of a first nitride III-V compound semiconductor containing In and Ga;

an intermediate layer in contact with the layer made of the first nitride III-V compound semiconductor, and made of a second nitride III-V compound semiconductor containing In and Ga and different from the first nitride III-V compound semiconductor;

a layer in contact with the intermediate layer and made of an eighth nitride III-V compound semiconductor containing Ga;

a cap layer in contact with the layer made of the eighth nitride III-V compound semiconductor, and having a superlattice structure in which barrier layers are made of a third nitride III-V compound semiconductor containing Al and Ga;

a layer in contact with the cap layer and made of a ninth nitride III-V compound semiconductor containing Ga; and a p-type clad layer in contact with the layer made of the ninth nitride III-V compound semiconductor, and made of a seventh nitride III-V compound semiconductor containing Al and Ga and different from the third nitride III-V compound semiconductor.

According to the 39th aspect of the invention, there is provided a semiconductor device comprising:

a layer made of a first nitride III-V compound semiconductor containing In and Ga;

a layer in contact with the layer made of the first nitride III-V compound semiconductor, and made of a sixth nitride III-V compound semiconductor containing Ga;

a cap layer in contact with the layer made of the sixth nitride III-V compound semiconductor, and having a superlattice structure in which barrier layers are made of a third nitride III-V compound semiconductor containing Al and Ga; and a p-type layer in contact with the cap layer and made of a seventh nitride III-V compound semiconductor containing Al and Ga and different from the third nitride III-V compound semiconductor.

According to the 40th aspect of the invention, there is provided a semiconductor device comprising:

a layer made of a first nitride III-V compound semiconductor containing In and Ga;

an intermediate layer in contact with the layer made of the first nitride III-V compound semiconductor, and made of a second nitride III-V compound semiconductor containing In and Ga and different from the first nitride III-V compound semiconductor;

a layer in contact with the intermediate layer and made of a sixth nitride III-V compound semiconductor containing Ga;

a cap layer in contact with the layer made of the sixth nitride III-V compound semiconductor, and having a superlattice structure in which barrier layers are made of the third nitride III-V compound semiconductor containing Al and Ga; and a p-type clad layer in contact with the cap layer and made of a seventh nitride III-V compound semiconductor containing Al and Ga and different from the third nitride III-V compound semiconductor.

According to the 41st aspect of the invention, there is provided a manufacturing method of a semiconductor device including a layer made of a first nitride III-V compound semiconductor containing In and Ga; a layer in contact with the layer made of the first nitride III-V compound semiconductor, and made of a sixth nitride III-V compound semiconductor containing Ga; a cap layer in contact with the layer made of the sixth nitride III-V compound semiconductor, and made of a third nitride III-V compound semiconductor containing Al and Ga; and a p-type layer in contact with the cap layer and made of a seventh nitride III-V compound semiconductor containing Al and Ga and different from the third nitride III-V compound semiconductor, comprising:

growing the layer made of the first nitride III-V compound semiconductor, the layer made of the sixth nitride III-V compound semiconductor and the cap layer in a carrier gas atmosphere containing substantially no hydrogen and containing nitrogen as the major component thereof; and growing the p-type layer in a carrier gas atmosphere containing nitrogen and hydrogen as major components thereof.

According to the 42nd aspect of the invention, there is provided a manufacturing method of a semiconductor device including a layer made of a first nitride III-V compound semiconductor containing In and Ga; a layer in contact with the layer made of the first nitride III-V compound semiconductor, and made of a sixth nitride III-V compound semiconductor containing Ga; a cap layer in contact with the layer made of the sixth nitride III-V compound semiconductor, and made of a third nitride III-V compound semiconductor containing Al and Ga; and a p-type layer in contact with the cap layer and made of a seventh nitride III-V compound semiconductor containing Al and Ga and different from the third nitride III-V compound semiconductor, comprising:

growing the layer made of the first nitride III-V compound semiconductor, the layer made of the sixth nitride III-V compound semiconductor and the cap layer at a growth temperature lower than the growth temperature of the p-type layer.

According to the 43rd aspect of the invention, there is provided a manufacturing method of a semiconductor device including a layer made of a first nitride III-V compound semiconductor containing In and Ga; an intermediate layer in contact with the layer made of the first nitride III-V compound semiconductor, and made of a second nitride III-V compound semiconductor containing In and Ga and different from the first nitride III-V compound semiconductor; a layer in contact with the intermediate layer and made of a sixth nitride III-V compound semiconductor containing Ga; a cap layer in contact with the layer made of the sixth nitride III-V compound semiconductor, and made of a third nitride III-V compound semiconductor containing Al and Ga; and a p-type layer in contact with the cap layer and made of a seventh nitride III-V compound semiconductor containing Al and Ga and different from the third nitride III-V compound semiconductor, comprising:

growing the layer made of the first nitride III-V compound semiconductor, the intermediate layer, the layer made of the sixth nitride III-V compound semiconductor and the cap layer in a carrier gas atmosphere containing substantially no hydrogen and containing nitrogen as the major component thereof; and growing the p-type layer in a carrier gas atmosphere containing nitrogen and hydrogen as major components thereof.

According to the 44th aspect of the invention, there is provided a manufacturing method of a semiconductor device including a layer made of a first nitride III-V compound semiconductor containing In and Ga; an intermediate layer in contact with the layer made of the first nitride III-V compound semiconductor, and made of a second nitride III-V compound semiconductor containing In and Ga and different from the first nitride III-V compound semiconductor; a layer in contact with the intermediate layer and made of a sixth nitride III-V compound semiconductor containing Ga; a cap layer in contact with the layer made of the sixth nitride III-V compound semiconductor, and made of a third nitride III-V compound semiconductor containing Al and Ga; and a p-type layer in contact with the cap layer and made of a seventh nitride III-V compound semiconductor containing Al and Ga and different from the third nitride III-V compound semiconductor, comprising:

growing the layer made of the first nitride III-V compound semiconductor, the intermediate layer, the layer made of the sixth nitride III-V compound semiconductor and the cap layer at a growth temperature lower than the growth temperature of the p-type clad layer.

Typically, the layer made of the first nitride III-V compound semiconductor and the intermediate layer are grown under a growth temperature lower than that of the layer made of the sixth nitride III-V compound semiconductor and the cap layer.

According to the 45th aspect of the invention, there is provided a manufacturing method of a semiconductor device including a layer made of a first nitride III-V compound semiconductor containing In and Ga; a layer in contact with the layer made of the first nitride III-V compound semiconductor, and made of an eighth nitride III-V compound semiconductor containing Ga; a cap layer in contact with the layer made of the eighth nitride III-V compound semiconductor, and made of a third nitride III-V compound semiconductor containing Al and Ga; a layer in contact with the cap layer and made of a ninth nitride III-V compound semiconductor containing Ga; and a p-type layer in contact with the layer made of the ninth nitride III-V compound semiconductor, and made of a seventh nitride III-V compound semiconductor containing Al and Ga and different from the third nitride III-V compound semiconductor, comprising:

growing the layer made of the first nitride III-V compound semiconductor, the layer made of the eighth nitride III-V compound semiconductor and the cap layer in a carrier gas atmosphere containing substantially no hydrogen and containing nitrogen as the major component thereof; and growing the layer made of the ninth nitride III-V compound semiconductor and the p-type layer in a carrier gas atmosphere containing nitrogen and hydrogen as major components thereof.

According to the 46th aspect of the invention, there is provided a manufacturing method of a semiconductor device including a layer made of a first nitride III-V compound semiconductor containing In and Ga; a layer in contact with the layer made of the first nitride III-V compound semiconductor, and made of an eighth nitride III-V compound semiconductor containing Ga; a cap layer in contact with the layer made of the eighth nitride III-V compound semiconductor, and made of a third nitride III-V compound semiconductor containing Al and Ga; a layer in contact with the cap layer and made of a ninth nitride III-V compound semiconductor containing Ga; and a p-type layer in contact with the layer made of the ninth nitride III-V compound semiconductor, and made of a seventh nitride III-V compound semiconductor containing Al and Ga and different from the third nitride III-V compound semiconductor, comprising:

growing the layer made of the first nitride III-V compound semiconductor, the layer made of the eighth nitride III-V compound semiconductor and the cap layer at a growth temperature lower than the growth temperature of the layer made of the ninth nitride III-V compound semiconductor and the p-type layer.

According to the 47th aspect of the invention, there is provided a manufacturing method of a semiconductor device including a layer made of a first nitride III-V compound semiconductor containing In and Ga; an intermediate layer in contact with the layer made of the first nitride III-V compound semiconductor, and made of a second nitride III-V compound semiconductor containing In and Ga and different from the first nitride III-V compound semiconductor; a layer in contact with the intermediate layer and made of an eighth nitride III-V compound semiconductor containing Ga; a cap layer in contact with the layer made of the eighth nitride III-V compound semiconductor, and made of a third nitride III-V compound semiconductor containing Al and Ga; a layer in contact with the cap layer and made of a ninth nitride III-V compound semiconductor containing Ga; and a p-type layer in contact with the layer made of the ninth nitride III-V compound semiconductor, and made of a seventh nitride III-V compound semiconductor containing Al and Ga and different from the third nitride III-V compound semiconductor, comprising:

growing the layer made of the first nitride III-V compound semiconductor, the intermediate layer, the layer made of the eighth nitride III-V compound semiconductor and the cap layer in a carrier gas atmosphere containing substantially no hydrogen and containing nitrogen as the major component thereof; and growing the layer made of the ninth nitride III-V compound semiconductor and the p-type layer in a carrier gas atmosphere containing nitrogen and hydrogen as major components thereof.

According to the 48th aspect of the invention, there is provided a manufacturing method of a semiconductor device including a layer made of a first nitride III-V compound semiconductor containing In and Ga; an intermediate layer in contact with the layer made of the first nitride III-V compound semiconductor, and made of a second nitride III-V compound semiconductor containing In and Ga and different from the first nitride III-V compound semiconductor; a layer in contact with the intermediate layer and made of an eighth nitride III-V compound semiconductor containing Ga; a cap layer in contact with the layer made of the eighth nitride III-V compound semiconductor, and made of a third nitride III-V compound semiconductor containing Al and Ga; a layer in contact with the cap layer and made of a ninth nitride III-V compound semiconductor containing Ga; and a p-type layer in contact with the layer made of the ninth nitride III-V compound semiconductor, and made of a seventh nitride III-V compound semiconductor containing Al and Ga and different from the third nitride III-V compound semiconductor, comprising:

growing the layer made of the first nitride III-V compound semiconductor, the intermediate layer, the layer made of the eighth nitride III-V compound semiconductor and the cap layer at a growth temperature lower than the growth temperature of the layer made of the ninth nitride III-V compound semiconductor and the p-type clad layer.

Typically, the layer made of the first nitride III-V compound semiconductor is grown under a growth temperature lower than that of the intermediate layer and the layer made of the eighth nitride III-V compound semiconductor.

According to the 49th aspect of the invention, there is provided a manufacturing method of a semiconductor device including a layer made of a first nitride III-V compound semiconductor containing In and Ga; a layer in contact with the layer made of the first nitride III-V compound semiconductor, and made of an eighth nitride III-V compound semiconductor containing Ga; a cap layer in contact with the layer made of the eighth nitride III-V compound semiconductor, and having a superlattice structure in which barrier layers are made of a third nitride III-V compound semiconductor containing Al and Ga; a layer in contact with the cap layer and made of a ninth nitride III-V compound semiconductor containing Ga; and a p-type layer in contact with the layer made of the ninth nitride III-V compound semiconductor, and made of a seventh nitride III-V compound semiconductor containing Al and Ga and different from the third nitride III-V compound semiconductor, comprising:

growing the layer made of the first nitride III-V compound semiconductor, the layer made of the eighth nitride III-V compound semiconductor and the cap layer in a carrier gas atmosphere containing substantially no hydrogen and containing nitrogen as the major component thereof; and growing the layer made of the ninth nitride III-V compound semiconductor and the p-type layer in a carrier gas atmosphere containing nitrogen and hydrogen as major components thereof.

According to the 50th aspect of the invention, there is provided a manufacturing method of a semiconductor device including a layer made of a first nitride III-V compound semiconductor containing In and Ga; a layer in contact with the layer made of the first nitride III-V compound semiconductor, and made of an eighth nitride III-V compound semiconductor containing Ga; a cap layer in contact with the layer made of the eighth nitride III-V compound semiconductor, and having a superlattice structure in which barrier layers are made of a third nitride III-V compound semiconductor containing Al and Ga; a layer in contact with the cap layer and made of a ninth nitride III-V compound semiconductor containing Ga; and a p-type layer in contact with the layer made of the ninth nitride III-V compound semiconductor, and made of a seventh nitride III-V compound semiconductor containing Al and Ga and different from the third nitride III-V compound semiconductor, comprising:

growing the layer made of the first nitride III-V compound semiconductor, the layer made of the eighth nitride III-V compound semiconductor and the cap layer at a growth temperature lower than the growth temperature of the layer made of the ninth nitride III-V compound semiconductor and the p-type clad layer.

According to the 51st aspect of the invention, there is provided a manufacturing method of a semiconductor device including a layer made of a first nitride III-V compound semiconductor containing In and Ga; an intermediate layer in contact with the layer made of the first nitride III-V compound semiconductor, and made of a second nitride III-V compound semiconductor containing In and Ga and different from the first nitride III-V compound semiconductor; a layer in contact with the intermediate layer and made of an eighth nitride III-V compound semiconductor containing Ga; a cap layer in contact with the layer made of the eighth nitride III-V compound semiconductor, and having a superlattice structure in which barrier layers are made of a third nitride III-V compound semiconductor containing Al and Ga; a layer in contact with the cap layer and made of a ninth nitride III-V compound semiconductor containing Ga; and a p-type layer in contact with the layer made of a ninth nitride III-V compound semiconductor, and made of a seventh nitride III-V compound semiconductor containing Al and Ga and different from the third nitride III-V compound semiconductor, comprising:

growing the layer made of the first nitride III-V compound semiconductor, the intermediate layer, the layer made of the eighth nitride III-V compound semiconductor and the cap layer in a carrier gas atmosphere containing substantially no hydrogen and containing nitrogen as the major component thereof; and growing the layer made of the ninth nitride III-V compound semiconductor and the p-type layer in a carrier gas atmosphere containing nitrogen and hydrogen as major components thereof.

According to the 52nd aspect of the invention, there is provided a manufacturing method of a semiconductor device including a layer made of a first nitride III-V compound semiconductor containing In and Ga; an intermediate layer in contact with the layer made of the first nitride III-V compound semiconductor, and made of a second nitride III-V compound semiconductor containing In and Ga and different from the first nitride III-V compound semiconductor; a layer in contact with the intermediate layer and made of an eighth nitride III-V compound semiconductor containing Ga; a cap layer in contact with the layer made of the eighth nitride III-V compound semiconductor, and having a superlattice structure in which barrier layers are made of a third nitride III-V compound semiconductor containing Al and Ga; a layer in contact with the cap layer and made of a ninth nitride III-V compound semiconductor containing Ga; and a p-type layer in contact with the layer made of a ninth nitride III-V compound semiconductor, and made of a seventh nitride III-V compound semiconductor containing Al and Ga and different from the third nitride III-V compound semiconductor, comprising:

growing the layer made of the first nitride III-V compound semiconductor, the intermediate layer, the layer made of the eighth nitride III-V compound semiconductor and the cap layer at a growth temperature lower than the growth temperature of the layer made of the ninth nitride III-V compound semiconductor and the p-type clad layer.

Typically, the layer made of the first nitride III-V compound semiconductor and the intermediate layer are grown under a growth temperature lower than that of the layer made of the eighth nitride III-V compound semiconductor and the cap layer.

According to the 53rd aspect of the invention, there is provided a manufacturing method of a semiconductor device including a layer made of a first nitride III-V compound semiconductor containing In and Ga; a layer in contact with the layer made of the first nitride III-V compound semiconductor, and made of a sixth nitride III-V compound semiconductor containing Ga; a cap layer in contact with the layer made of the sixth nitride III-V compound semiconductor, and having a superlattice structure in which barrier layers are made of a third nitride III-V compound semiconductor containing Al and Ga; and a p-type layer in contact with the cap layer and made of a seventh nitride III-V compound semiconductor containing Al and Ga and different from the third nitride III-V compound semiconductor, comprising:

growing the layer made of the first nitride III-V compound semiconductor, the layer made of the sixth nitride III-V compound semiconductor and the cap layer in a carrier gas atmosphere containing substantially no hydrogen and containing nitrogen as the major component thereof; and growing the p-type layer in a carrier gas atmosphere containing nitrogen and hydrogen as major components thereof.

According to the 54th aspect of the invention, there is provided a manufacturing method of a semiconductor device including a layer made of a first nitride III-V compound semiconductor containing In and Ga; a layer in contact with the layer made of the first nitride III-V compound semiconductor, and made of a sixth nitride III-V compound semiconductor containing Ga; a cap layer in contact with the layer made of the sixth nitride III-V compound semiconductor, and having a superlattice structure in which barrier layers are made of a third nitride III-V compound semiconductor containing Al and Ga; and a p-type layer in contact with the cap layer and made of a seventh nitride III-V compound semiconductor containing Al and Ga and different from the third nitride III-V compound semiconductor, comprising:

growing the layer made of the first nitride III-V compound semiconductor, the layer made of the sixth nitride III-V compound semiconductor and the cap layer at a growth temperature lower than the growth temperature of the p-type layer.

According to the 55th aspect of the invention, there is provided a manufacturing method of a semiconductor device including a layer made of a first nitride III-V compound semiconductor containing In and Ga; an intermediate layer in contact with the layer made of the first nitride III-V compound semiconductor, and made of a second nitride III-V compound semiconductor containing In and Ga and different from the first nitride III-V compound semiconductor; a layer in contact with the intermediate layer and made of a sixth nitride III-V compound semiconductor containing Ga; a cap layer in contact with the layer made of the sixth nitride III-V compound semiconductor, and having a superlattice structure in which barrier layers are made of the third nitride III-V compound semiconductor containing Al and Ga; and a p-type layer in contact with the cap layer and made of a seventh nitride III-V compound semiconductor containing Al and Ga and different from the third nitride III-V compound semiconductor, comprising:

growing the layer made of the first nitride III-V compound semiconductor, the intermediate layer, the layer made of the sixth nitride III-V compound semiconductor and the cap layer in a carrier gas atmosphere containing substantially no hydrogen and containing nitrogen as the major component thereof; and growing the p-type layer in a carrier gas atmosphere containing nitrogen and hydrogen as major components thereof.

According to the 56th aspect of the invention, there is provided a manufacturing method of a semiconductor device including a layer made of a first nitride III-V compound semiconductor containing In and Ga; an intermediate layer in contact with the layer made of the first nitride III-V compound semiconductor, and made of a second nitride III-V compound semiconductor containing In and Ga and different from the first nitride III-V compound semiconductor; a layer in contact with the intermediate layer and made of a sixth nitride III-V compound semiconductor containing Ga; a cap layer in contact with the layer made of the sixth nitride III-V compound semiconductor, and having a superlattice structure in which barrier layers are made of the third nitride III-V compound semiconductor containing Al and Ga; and a p-type layer in contact with the cap layer and made of a seventh nitride III-V compound semiconductor containing Al and Ga and different from the third nitride III-V compound semiconductor, comprising:

growing the layer made of the first nitride III-V compound semiconductor, the intermediate layer, the layer made of the sixth nitride III-V compound semiconductor and the cap layer at a growth temperature lower than the growth temperature of the p-type layer.

Typically, the layer made of the first nitride III-V compound semiconductor and the intermediate layer are grown under a growth temperature lower than that of the layer made of the sixth nitride III-V compound semiconductor and the cap layer.

In the 9th to 56th aspects of the invention, the sixth nitride III-V compound semiconductor containing Ga, eighth nitride III-V compound semiconductor and ninth nitride III-V compound semiconductor layer may contain In, Al or B, for example, as a group III element other than Ga, and may contain As or P as a group V element. The seventh nitride III-V compound semiconductor containing Al and Ga may contain In, or B, for example, as a group III element other than Al and Ga, and may contain As or P as a group V element.

In the 9th to 56th aspects of the invention, the band gap of the cap layer is typically larger than the band gap of the p-type clad layer or the p-type layer. Thickness of the cap layer is preferably equal to or more than 2 nm to ensure a sufficient effect by the use of the cap layer. However, if the cap layer is excessively thick, the crystalline quality deteriorates in some kinds of composition. To prevent it, thickness of the cap layer is preferably limited not to exceed 20 nm. If the optical guide layer, first optical guide layer, layer made of the sixth nitride III-V compound semiconductor or layer made of the eighth nitride III-V compound is doped with Mg or other p-type impurity semiconductor, the specific resistance rather increases. Therefore, it is preferably undoped. The optical guide layer, first optical guide layer, layer made of the sixth nitride III-V compound semiconductor or layer made of the eighth nitride III-V compound exhibits an n-type conductivity when it is undoped. Thickness of the optical guide layer, first optical guide layer, layer made of the sixth nitride III-V compound semiconductor or layer made of the eighth nitride III-V compound is, in general, equal to larger than 8 nm, and it is typically controlled in the range from 10 nm to 100 nm.

As to carrier gas atmosphere used for growth of layers of semiconductor light emitting devices or semiconductor devices, in order to obtain a layer with a lower resistance, a $N_2$ gas atmosphere is most preferably used as the carrier gas atmosphere containing substantially no hydrogen and containing nitrogen as its major component, and a mixed gas atmosphere containing $N_2$ and $H_2$ is used as the carrier gas atmosphere containing nitrogen and hydrogen as its major components.

In the 9th to 56th aspects of the invention, the statement made with reference to the first to eighth aspects of the invention are here again recommended as far as they are consistent to their natures.

According to the invention summarized above, since the intermediate layer made of the second nitride III-V compound semiconductor containing In and Ga and different from the first nitride III-V compound semiconductor is provided in contact with the active layer or the layer made of the first nitride III-V compound semiconductor, the intermediate layer largely alleviates the stress produced in the active layer or the layer made of the first nitride III-V compound semiconductor, or effectively prevents Mg used as the p-type dopant from diffusion into the active layer or the layer made of the first nitride III-V compound semiconductor.

Additionally, by optimizing the position of the cap layer, the optical guide layer or the first optical guide layer can be grown in a good crystalline quality as compared with a structure locating the cap layer adjacent to the active layer via the intermediate layer, for example, or the optical guide layer or the first optical guide layer can be optimized in thickness.

DETAILED DESCRIPTION OF THE PRESENTLY PREFERRED EMBODIMENTS

Figure 1:
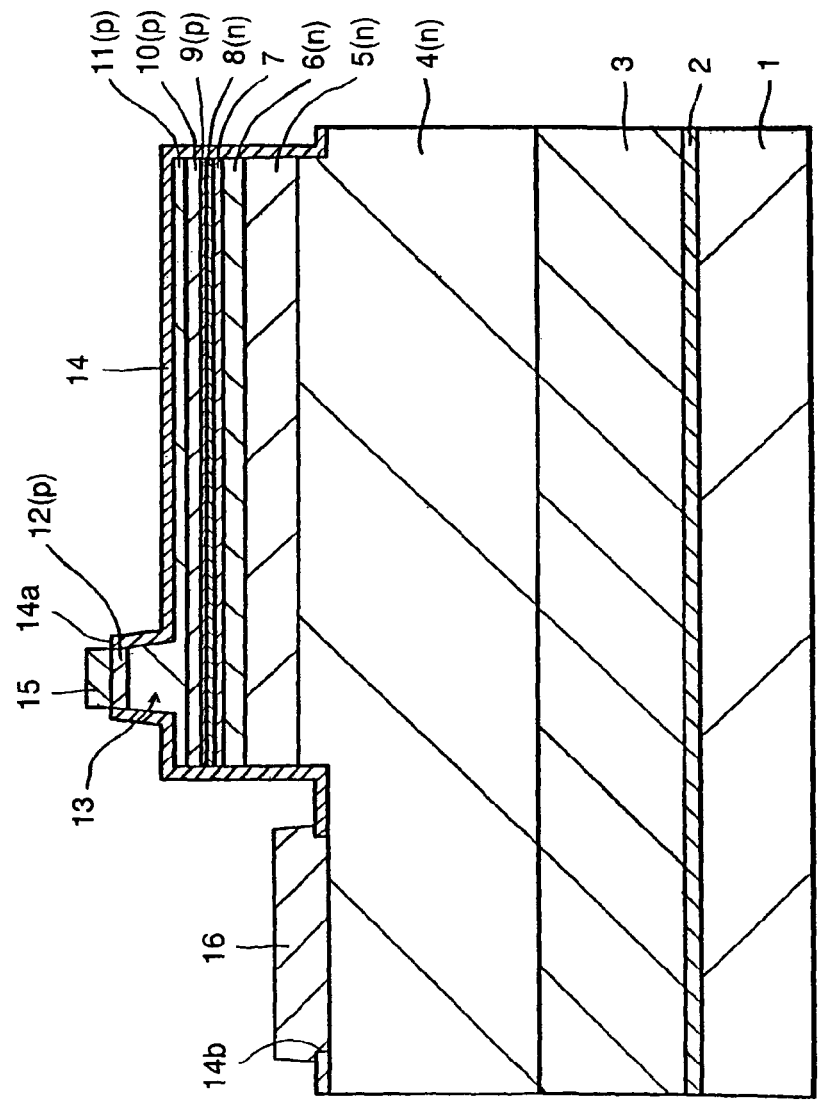
FIG. 1 is a cross-sectional view showing a GaN compound semiconductor laser according to the first embodiment of the invention.

Embodiments of the invention will now be explained below with reference to the drawings.

In all figures showing embodiments of the invention, identical or equivalent components are labeled with common reference numerals.

FIG. 1 shows a GaN compound semiconductor laser according to the first embodiment of the invention. This GaN compound semiconductor laser has a ridge structure and a SCH (separate confinement heterostructure) structure.

As shown in FIG. 1, the GaN compound semiconductor laser according to the first embodiment includes an undoped GaN layer 3 grown by lateral crystal growth technique such as ELO: n-type GaN contact layer 4; n-type AlGaN clad layer 5; n-type GaN optical guide layer 6; active layer 7 having an undoped $In_xGa_{1-x}N/In_yGa_{1-y}N$ multiquantum well structure, for example; n-type undoped InGaN deterioration preventing layer 8; p-type AlGaN cap layer 9; p-type GaN optical guide layer 10; p-type AlGaN clad layer 11; and p-type GaN contact layer 12 that are sequentially overlaid on a c-plane sapphire substrate 1 via an undoped GaN buffer layer 2 grown at a low temperature.

The undoped GaN buffer layer 2 is 30 nm thick, for example. The undoped GaN layer 3 is 0.5 μm thick, for example. The n-type GaN contact layer 4 is 4 μm thick, for example, and silicon (Si), for example, is doped as an n-type impurity. The n-type AlGaN clad layer 5 is 1.0 μm thick, for example, and Si, for example, is doped as an n-type impurity. Its Al composition may be 0.07, for example. The n-type GaN optical guide layer 6 is 0.1 μm thick, for example, and Si, for example, is doped as an n-type impurity. In the active layer 7 of the undoped $In_xGa_{1-x}N/In_yGa_{1-y}N$ multiquantum well structure, each $In_xGa_{1-x}N$ layer as a well layer may be 3.5 nm thick, and x=0.14. Each $In_yGa_{1-y}N$ layer as a barrier layer may be 7 nm thick, and y=0.02. The active layer 7 includes three such well layers.

The undoped InGaN deterioration preventing layer 8 has a graded structure in which the indium composition gradually, monotonously decreases from the surface in contact with the active layer toward the surface in contact with the p-type AlGaN cap layer 9. The indium composition along the surface in contact with the active layer 7 is equal to the Indium composition y of the $In_yGa_{1-y}N$ barrier layers of the active layer 7, and the indium composition along the surface in contact with the p-type AlGaN cap layer is 0. The undoped InGaN deterioration preventing layer 8 is 20 nm thick, for example.

The p-type AlGaN cap layer 9 is 10 nm thick, for example, and magnesium (Mg), for example, is doped as a p-type impurity. Al composition of the p-type AlGaN cap layer 9 may be 0.2, for example. As already explained, the p-type AlGaN cap layer 9 is provided to prevent the active layer 7 from deterioration by elimination of In therefrom during growth of the p-type GaN optical guide layer 10, p-type AlGaN clad layer 11 and p-type GaN contact layer 12 and simultaneously prevent overflow of carriers (electrons) from the active layer 9. Thickness of the p-type GaN optical guide layer 10 is 0.1 μm, for example, and Mg, for example, is doped as a p-type impurity. Thickness of the p-type AlGaN clad layer 11 is 0.5 μm, for example, and Mg, for example, is doped as a p-type impurity. Its Al composition is 0.07, for example. Thickness of the p-type GaN contact layer 12 is 0.1 μm, for example, and Mg, for example, is doped as a p-type impurity.

An upper part of the n-type GaN contact layer 4, n-type AlGaN clad layer 5, n-type GaN optical guide layer 6, active layer 7, undoped InGaN deterioration preventing layer 8, p-type AlGaN cap layer 9, p-type GaN optical guide layer 10 and p-type GaN clad layer 11 are shaped into a mesa configuration of a predetermined width. In the upper part of the p-type AlGaN clad layer 11 and the p-type contact layer 13 in the mesa portion, a ridge 13 is formed to extend in the <11-20> direction, for example. Width of the ridge 13 is 3 μm, for example.

An insulating film 14 such as a $SiO_2$ film having the thickness of 0.3 μm, for example, is formed to cover the entirety of the mesa portion. The insulating film 14 is provided for the purpose of electrical insulation and surface protection. The insulating film 14 has an aperture above the ridge 13, and a p-side electrode 15 is in contact with the p-type GaN contact layer 13 through the aperture 14a. The p-side electrode 15 has a multi-layered structure including sequentially overlaid Pd film, Pt film and Au film, which are 10 nm, thick, 100 nm thick and 300 nm thick, for example, respectively. The insulating film 14 has another aperture 14b in a predetermined portion adjacent the mesa portion, and an n-side electrode 16 is in contact with the n-type GaN contact layer 4 through the aperture 14b. The n-side electrode has a multi-layered structure including sequentially overlaid Ti film, Pty film and Au film, which are 10 nm thick, 50 nm thick and 100 nm thick, for example, respectively.

Figure 2:
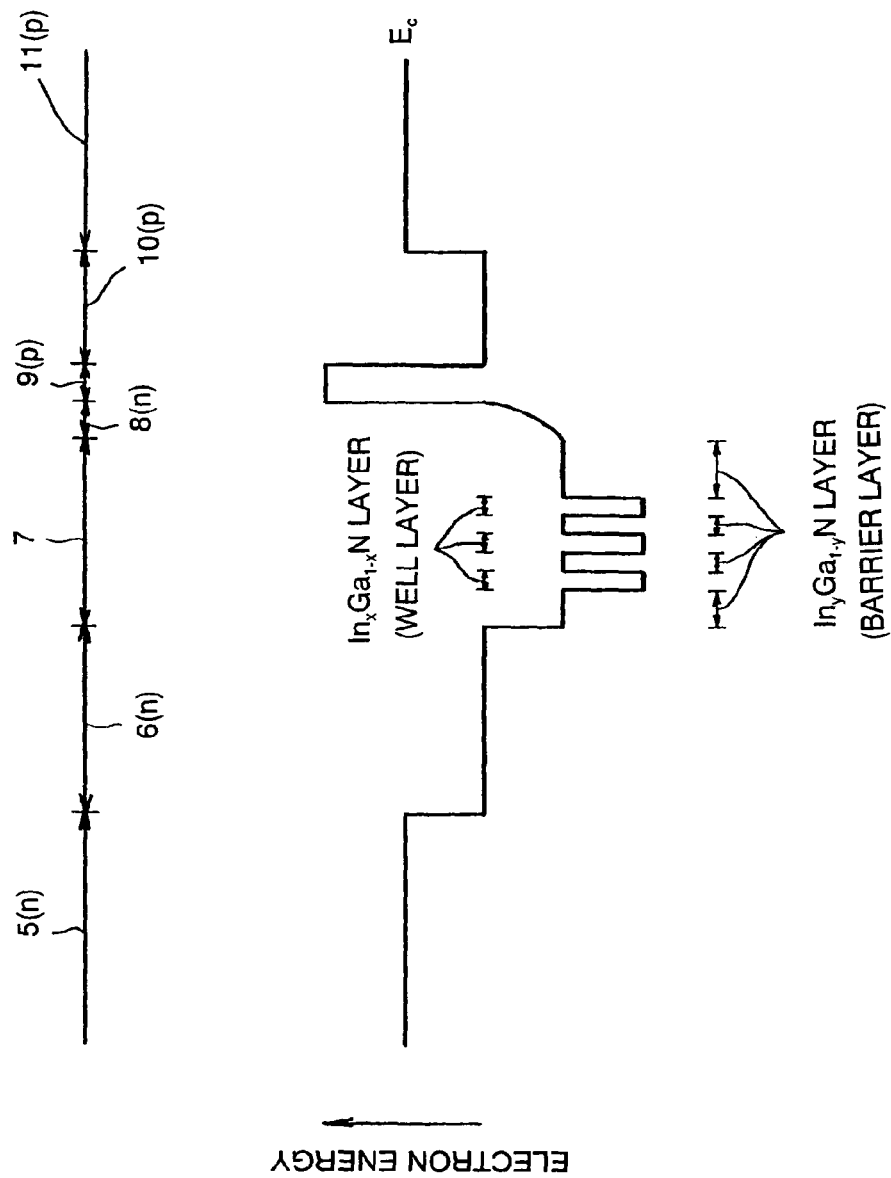
FIG. 2 is a schematic diagram showing an energy band structure of the GaN compound semiconductor laser according to the first embodiment of the invention.

FIG. 2 shows an energy band structure (conduction band) of a substantial part of the GaN compound semiconductor laser. In FIG. 2, $E_c$ denotes the bottom energy of the conduction band.

Next explained is a manufacturing method of the GaN compound semiconductor laser according to the first embodiment.

First prepared is a c-plane sapphire substrate 1 with a surface cleaned by thermal cleaning, for example, and the undoped GaN buffer layer 2 is grown on the c-plane sapphire substrate 1 by metal organic chemical vapor deposition (MOCVD) at a temperature around 500° C., for example. Thereafter, the undoped GaN layer 3 is grown by MOCVD at the growth temperature of 1000° C., for example, by lateral crystal growth technique such as ELO.

Consecutively, the n-type GaN contact layer 4, n-type AlGaN clad layer 5, n-type GaN optical guide layer 6, active layer 7 of the undoped $In_xGa_{1-x}N/In_yGa_{1-y}N$ multiquantum well structure, undoped InGaN deterioration preventing layer 8, p-type AlGaN cap layer 9, p-type GaN optical guide layer 10, p-type AlGaN clad layer 11 and p-type GaN contact layer 12 are sequentially grown on the undoped GaN layer 3 by MOCVD. For growth of the layers not containing In, namely, the n-type GaN contact layer 4, n-type AlGaN clad layer 5, n-type GaN optical guide layer 6, p-type AlGaN cap layer 9, p-type GaN optical guide layer 10, p-type AlGaN clad layer 11 and p-type GaN contact layer 12, the growth temperature adjusted to 1000° C., for example. For growth of the active layer 7 having the $Ga_{1-x}In_xN/Ga_{1-y}In_yN$ multiquantum well structure, which does not contain In, the growth temperature is controlled within 700 to 800° C. for example, e.g. at 730° C. for example. For growth of the undoped InGaN deterioration-preventing layer 8, its growth temperature is set at the same value as the growth temperature of the active layer 7, namely, 730° C., for example, at the beginning of the growth, and thereafter, it is gradually raised linearly, for example, such that it rises up to the same growth temperature as that of the p-type AlGaN cap layer 9, namely 835° C. for example, at the end of the growth.

As to source materials of these GaN compound semiconductor layers, trimethyl gallium $((CH_3)_3Ga, TMG)$ is used as the source material of Ga, trimethyl aluminum $((CH_3)_3Al, TMA)$ is used as the source material of Al, trimethyl indium $((CH_3)_3In, TMI)$ is used as the source material of In, and $NH_3$ is used as the source material of N, for example. Carrier gas may be $H_2$, for example. As to dopants, silane $(SiH_4)$, for example, is used as the n-type dopant, and bis=methylcyclopentadienile magnesium $((CH_3C_5H_4)_2Mg)$ or bis=cyclopentadienile magnesium $((C_5H_5)_2Mg)$, for example, is used as the p-type dopant.

In the next process, the c-plane sapphire substrate 1 having the GaN compound semiconductor layers grown thereon is taken out of the MOCVD apparatus. Then a $SiO_2$ film (not shown), 0.1 μm thick, for example is formed on the entire surface of the p-type GaN contact layer 12 by CVD, vacuum evaporation, sputtering, or the like, for example. After that, on this $SiO_2$ film, a resist pattern (not shown) of a predetermined geometry corresponding to the shape of the mesa portion is formed by photolithography. Using this resist pattern as a mask, the $SiO_2$ film is next etched and patterned by wet etching using an etching liquid of the fluoric acid series, or by RIE using an etching gas containing fluorine, such as $CF_4$ or $CHF_3$. Subsequently, using the $SiO_2$ film of the predetermined geometry as a mask, etching is carried out by RIE, for example, to the depth reaching the n-type GaN contact layer 4. As the etching gas for RIE, a chlorine-series gas may be used as the etching gas, for example. As a result of this etching, upper part of the n-type GaN contact layer 4, n-type AlGaN cladding layer 5, n-type GaN waveguide layer 6, active layer 7, undoped InGaN deterioration-preventing layer 8, p-type AlGaN cap layer 9, p-type GaN waveguide layer 10, p-type AlGaN cladding layer 11 and p-type GaN contact layer 12 are patterned into a mesa configuration.

After that, the $SiO_2$ film used as the etching mask is removed, and another $SiO_2$ film (not shown), 0.2 μm thick for example, is again formed on the entire substrate surface by CVD, vacuum evaporation or sputtering, for example. Thereafter, a resist pattern (not shown) of a predetermined geometry corresponding to the shape of the ridge portion is formed on the $SiO_2$ film by photolithography. After that, using this resist pattern as a mask, the $SiO_2$ film is selectively etched into a pattern corresponding to the ridge portion by wet etching using an etching liquid of the fluoric acid series, or by RIE using an etching gas containing fluorine, such as $CF_4$ or $CHF_3$.

In the next process, using the $SiO_2$ film as a mask, the p-type AlGaN cladding layer 11 is selectively etched by RIE to a predetermined depth to make out the ridge 13. In this RIE process, a chlorine-series gas may be used as the etching gas, for example.

After that, the $SiO_2$ film used as the etching mask is removed, and the insulating layer 14 such as a $SiO_2$ film, 0.3 μm thick for example, is formed on the entire substrate surface by CVD, vacuum evaporation or sputtering, for example.

Subsequently, a resist pattern (not shown) is formed to cover a selective part of the insulating film 14 excluding the region for the n-side electrode by photolithography.

Next using this resist pattern as a mask, the insulating film 14 is selectively etched to form the aperture 14b.

In the next process, maintaining the resist pattern there, a Ti film, Pt film and Au film are sequentially deposited on the entire substrate surface by vacuum evaporation, for example. Thereafter, the resist pattern is removed together with the overlying part of the Ti film, Pt film and Au film (lift-off). As a result, the n-side electrode 16 is formed in contact with the n-type GaN contact layer 4 through the aperture 14b in the insulating film 14. The Ti film, Pt film and Au film forming the n-side electrode 16 are, respectively, 10 nm thick, 50 nm thick and 100 nm thick. An alloying process is next carried out for making ohmic contact of the n-side electrode 16.

Subsequently, after the aperture 14a is formed by selectively removing the insulating film 14 from above the ridge 13 by etching in a similar process, and the p-side electrode 15 having the Pd/Pt/Au structure in contact with the p-type GaN contact layer 12 through the aperture 14a is formed in the same manner as the n-side electrode 16. Thereafter, an alloying process is carried out for making ohmic contact of the p-side electrode 15.

After that, the substrate having the laser structure thereon is divided into bars by cleavage, for example, to make out opposite cavity edges, and after the cavity edges are processed by edge coating, each bar is divided into chips by cleavage, or the like.

Through those steps, the intended GaN compound semiconductor laser having the ridge structure and the SCH structure is completed.

GaN compound semiconductor lasers according to the first embodiment and GaN semiconductor lasers not including the undoped InGaN deterioration preventing layer but equal to the former lasers in the other respects were prepared and subjected to a life test. As a result, GaN compound semiconductor lasers according to the first embodiment exhibited very small initial deterioration rates as compared with the latter GaN semiconductor lasers, and although the operation currents of the former lasers tended to gradually increase with time, their gradients were very small and negligible levels. This life test was carried out under the condition of optical output being 30 mW and atmosphere temperature being 60° C. for both the former and latter lasers. Additionally, electroluminescent emission of these GaN compound semiconductor lasers was observed. As a result, although noticeably uneven emission was observed in the latter GaN compound semiconductors, no uneven emission was observed in the GaN compound semiconductor lasers according to the first embodiment.

As explained above, according to the first embodiment, since the laser includes the undoped InGaN deterioration preventing layer 8 in contact with the active layer 7 and the p-type AlGaN cap layer 9 in contact with the undoped InGaN deterioration preventing layer, the undoped InGaN deterioration preventing layer 8 largely alleviates the stress produced in the active layer 7 by the p-type AlGaN cap layer 9, and effectively prevents Mg used as p-type dopants of p-type layers from diffusing into the active layer 7. As a result, the high-performance GaN compound semiconductor laser elongated in lifetime, highly reliable and free from emission unevenness can be realized.

Figure 3:
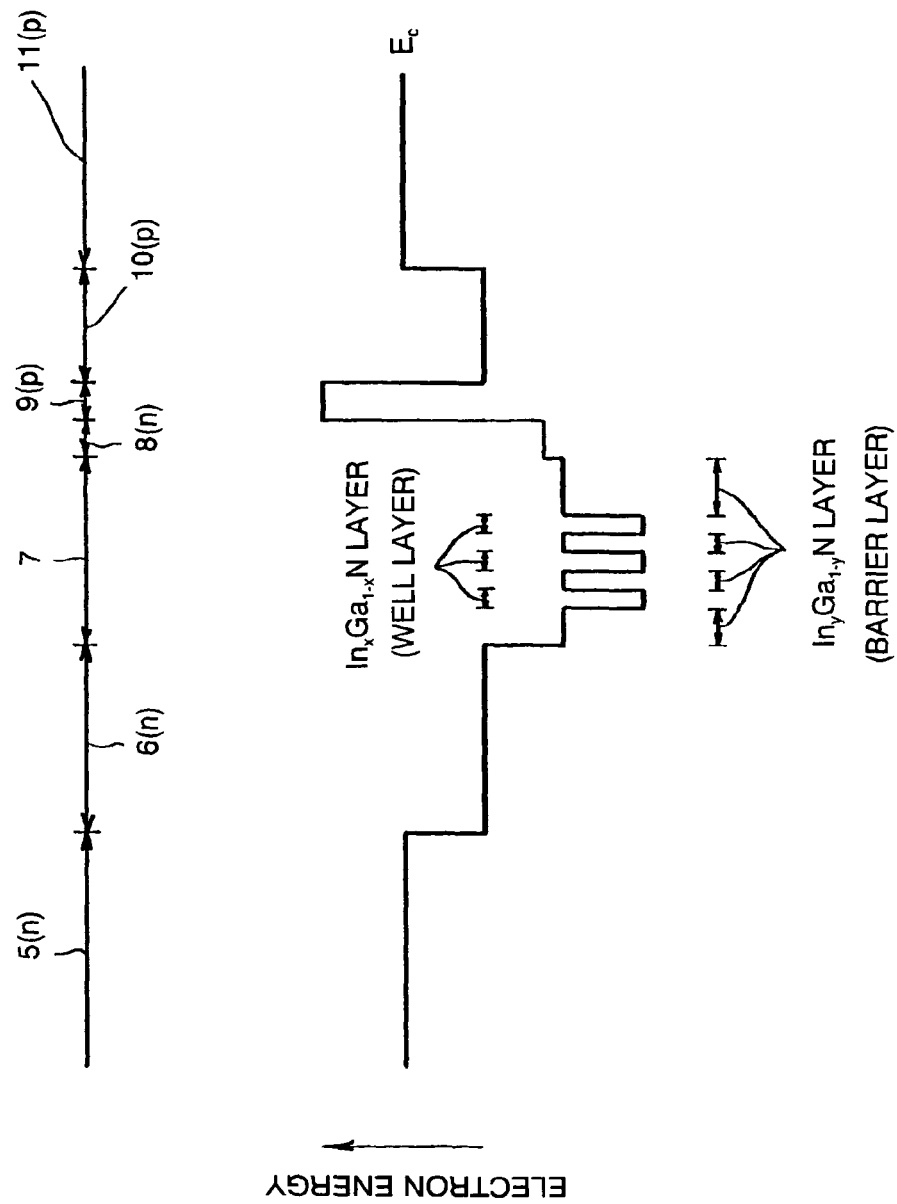
FIG. 3 is a schematic diagram showing an energy band structure of a GaN compound semiconductor laser according to the second embodiment of the invention.

Next explained is a GaN compound semiconductor laser according to the second embodiment of the invention. FIG. 3 is an energy band diagram of this GaN compound semiconductor laser.

In the GaN compound semiconductor laser according to the second embodiment, Indium composition in the undoped InGaN deterioration preventing layer is uniform throughout the entire thickness thereof, and the indium composition is adjusted to a value smaller than the Indium composition y of the barrier layers in the active layer 7, namely 0.02, for example. In the other respects, its structure is identical to that of the GaN compound semiconductor laser according to the first embodiment. So, its explanation is omitted here.

This GaN compound semiconductor laser can be manufactured by the same method as that of the GaN compound semiconductor laser according to the first embodiment except that the undoped InGaN deterioration preventing layer 8 is grown under a constant growth temperature.

The second embodiment also ensures the same advantages as those of the first embodiment.

Figure 4:
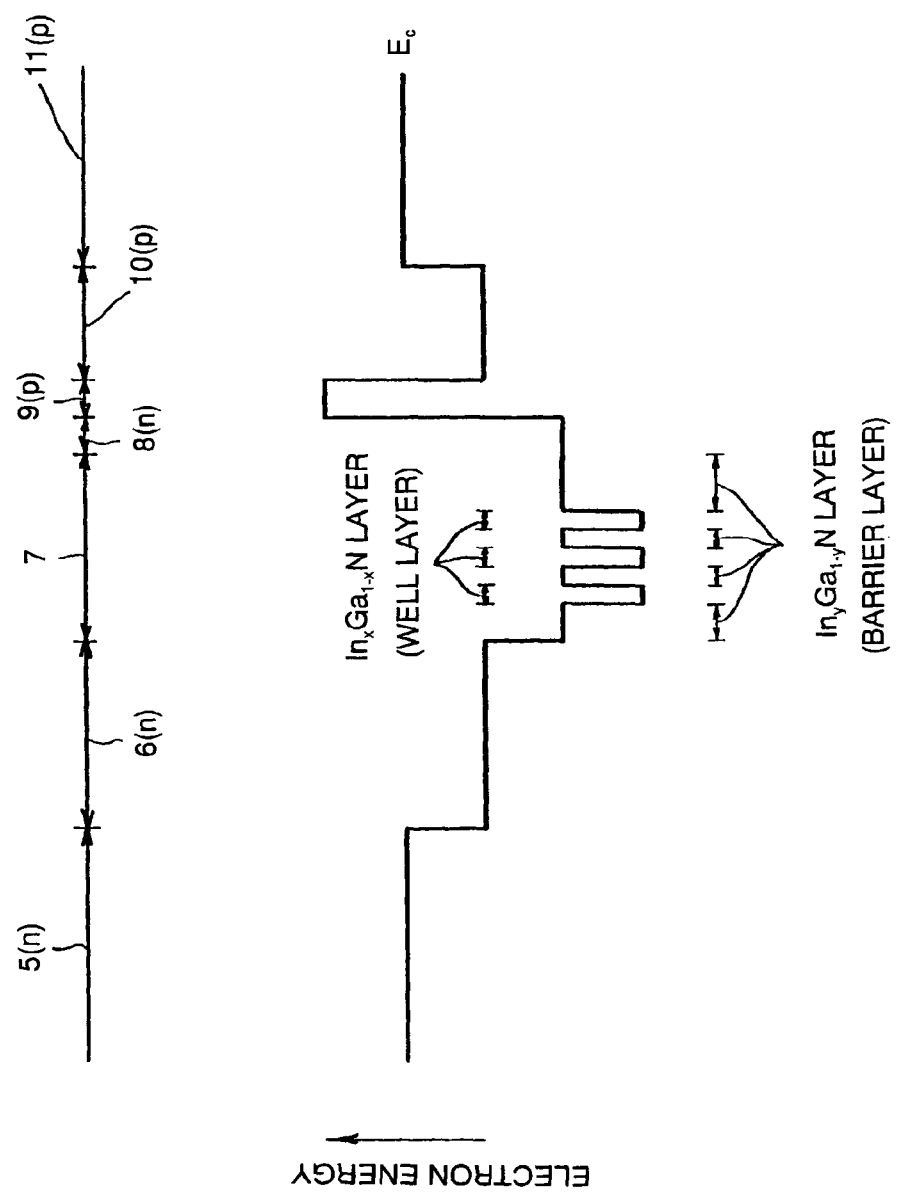
FIG. 4 is a schematic diagram showing an energy band structure of the GaN compound semiconductor laser according to the third embodiment of the invention.

Next explained is a GaN compound semiconductor laser according to the third embodiment of the invention. FIG. 4 is an energy band diagram of this GaN compound semiconductor laser.

In the GaN compound semiconductor laser according to the third embodiment, Indium composition of the undoped InGaN deterioration preventing layer is uniform throughout the entire thickness thereof, and the indium composition is adjusted to the same value as the Indium composition y of the barrier layers in the active layer 7. Thickness of the undoped InGaN deterioration preventing layer 8 is adjusted such that the sum of its own thickness and the thickness of one of the barrier layers of the active layer 7 nearest thereto is at least 15 nm, preferably not thinner than 17 nm, more preferably not thinner than 20 nm, or still more preferably not thinner than 25 nm. In the other respects, its structure is identical to that of the GaN compound semiconductor laser according to the first embodiment. So, its explanation is omitted here.

Here again, this GaN compound semiconductor laser can be manufactured by the same method as that of the GaN compound semiconductor laser according to the first embodiment except that the undoped InGaN deterioration preventing layer 8 is grown under a constant growth temperature.

The third embodiment also ensures the same advantages as those of the first embodiment.

Figure 5:
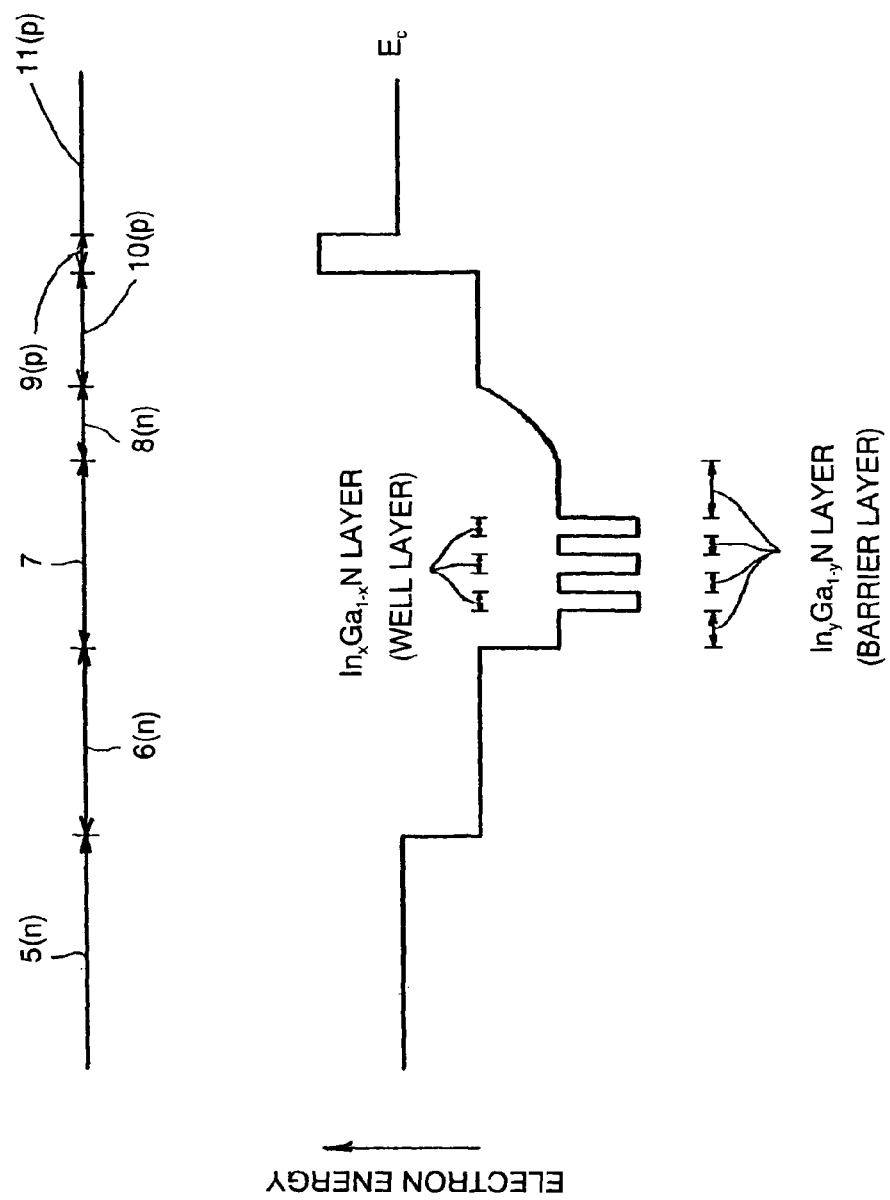
FIG. 5 is a schematic diagram showing an energy band structure of the GaN compound semiconductor laser according to the first embodiment of the invention.

Next explained is a GaN compound semiconductor laser according to the fourth embodiment of the invention. FIG. 5 is an energy band diagram of this GaN compound semiconductor laser.

The GaN compound semiconductor laser according to the fourth embodiment is so configured that the undoped InGaN deterioration preventing layer 8 is in contact with the active layer 7, the p-type GaN optical guide layer 10 is in contact with the undoped InGaN deterioration preventing layer 8, and the p-type AlGaN cap layer 9 is in contact with the p-type GaN optical guide layer 10. Distribution of the indium composition in the undoped InGaN deterioration preventing layer 8 is identical to that of the first embodiment. In the other respects, its structure is identical to that of the GaN compound semiconductor laser according to the first embodiment. So, its explanation is omitted here.

Here again, this GaN compound semiconductor laser can be manufactured by the same method as that of the GaN compound semiconductor laser according to the first embodiment.

The fourth embodiment also ensures the same advantages as those of the first embodiment.

Figure 6:
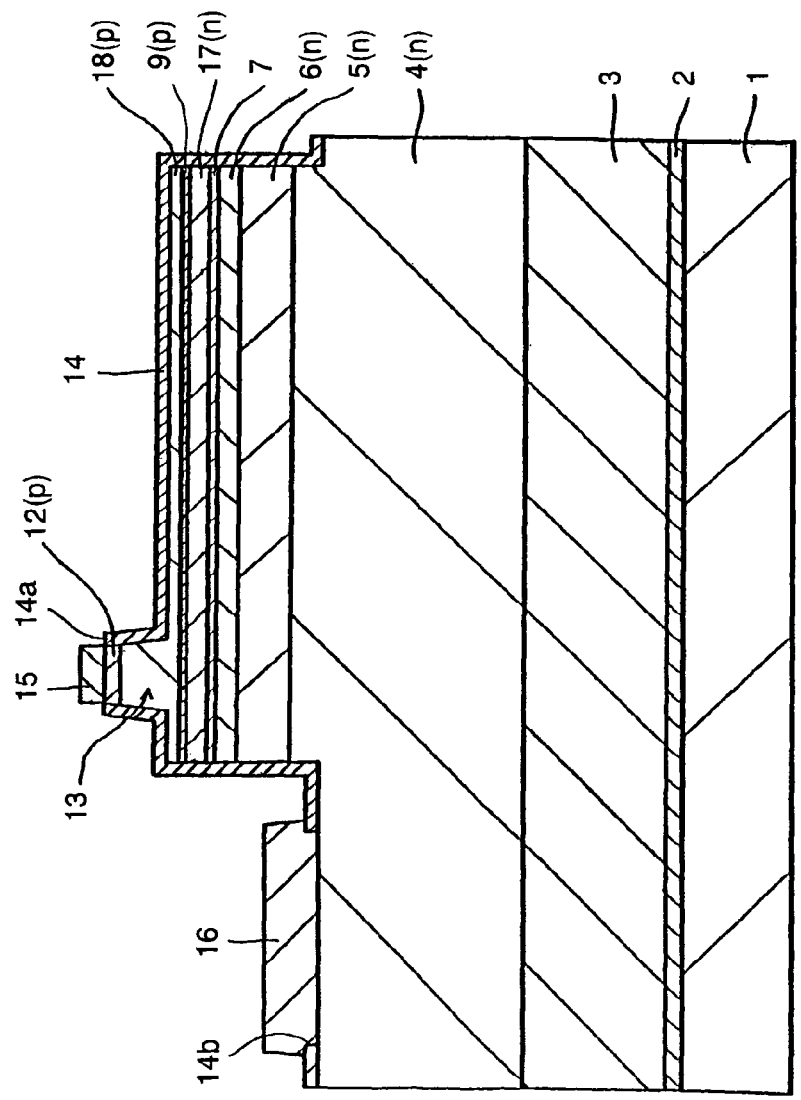
FIG. 6 is a cross-sectional view showing a GaN compound semiconductor laser according to the fifth embodiment of the invention.
Figure 7:
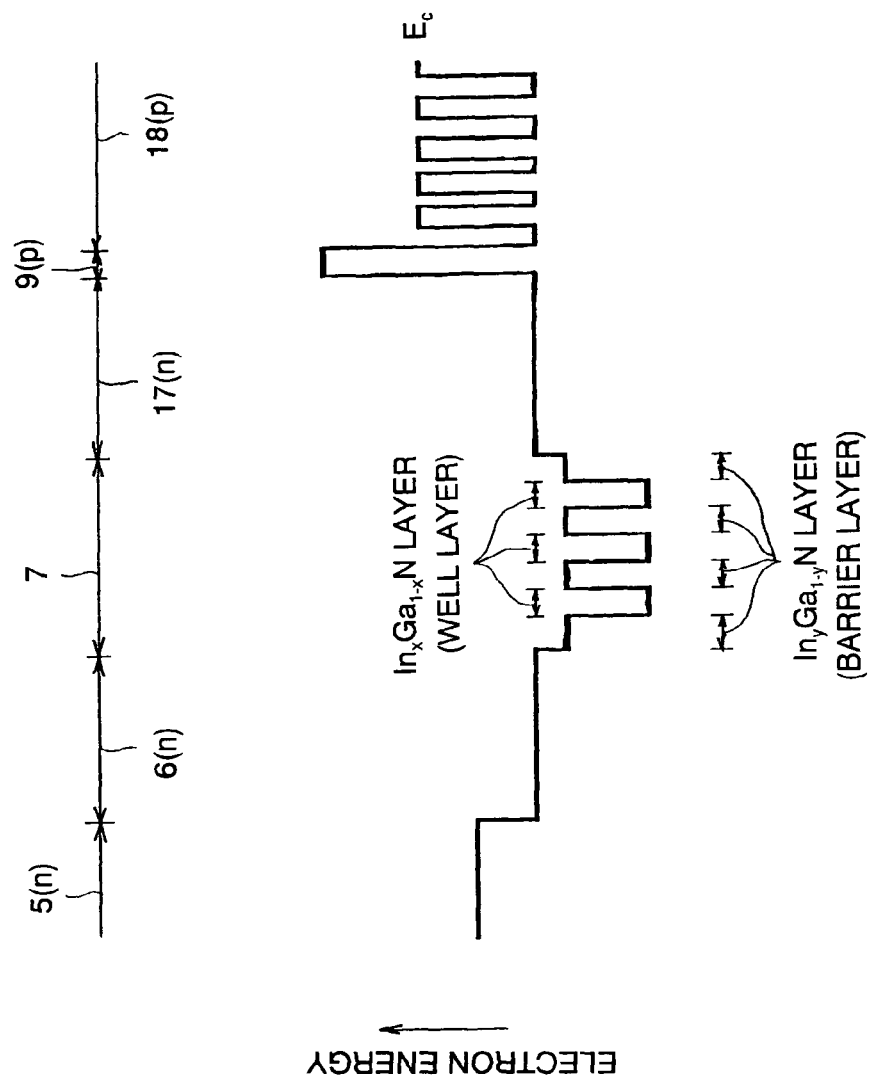
FIG. 7 is a schematic diagram showing an energy band structure of the GaN compound semiconductor laser according to the fifth embodiment of the invention.

Next explained is a GaN compound semiconductor laser according to the fifth embodiment of the invention. FIG. 6 shows the GaN compound semiconductor laser according to the fifth embodiment. FIG. 7 is an energy band diagram of this GaN compound semiconductor laser.

In the GaN compound semiconductor laser according to the fifth embodiment, an undoped GaN optical guide layer 17 is formed in contact with the active layer; the p-type AlGaN cap layer 9 is in contact with the undoped GaN optical guide layer 17; and a p-type AlGaN/GaN superlattice clad layer 18 is formed in contact with the p-type AlGaN cap layer 9. The laser of this embodiment does not include the undoped InGaN deterioration preventing layer 8. The undoped GaN optical guide layer 17 exhibits n-type conductivity. Thickness of the undoped GaN optical guide layer 17 is usually 10~100 nm; however, it is limited to 20~40 nm in this embodiment. The p-type AlGaN/GaN superlattice clad layer 18 has a structure alternately stacking undoped AlGaN layers as barrier layers each having the thickness of 2.5 nm and Al composition of 12%, for example, and Mg-doped GaN layers as well layers each having the thickness of 2.5 nm here again, for example, and the total thickness of the clad layer 18 is, for example, 0.5 μm. For the purpose of preventing electrons injected into the active layer from moving through the p-type AlGaN cap layer 9 to the p-type AlGaN/GaN superlattice clad layer 18 by tunneling, distance between the p-type AlGaN cap layer 9 and nearest one of the barrier layers of the p-type AlGaN/GaN superlattice clad layer 18 is adjusted to a value capable of preventing the tunneling, namely about 10 nm, for example. The purpose of using the p-type AlGaN/GaN superlattice clad layer 18 is to facilitate holes to move therethrough by tunneling. In the other respects, the structure of the laser shown here is identical to that of the GaN compound semiconductor laser according to the first embodiment. So, its explanation is omitted here.

This GaN compound semiconductor laser can be manufactured by essentially the same method as that of the GaN compound semiconductor laser according to the first embodiment. In this embodiment, however, the following special conditions are used for growth temperature and carrier gas when growing individual layers. For example, growth temperature is set at 1000° C. for growth of layers from the undoped GaN layer 3 to the n-type AlGaN clad layer 5, at 800° C. for growth of layers from the n-type GaN optical guide layer 6 to the p-type AlGaN cap layer 9, and at 1000° C. for growth of the p-type AlGaN/GaN superlattice clad layer 18 and the p-type GaN contact layer 12. As to carrier gas, a mixed gas atmosphere containing $N_2$ and $H_2$ is used for growth of layers from the undoped GaN layer 3 to the n-type AlGaN clad layer 5, a $N_2$ atmosphere is used for growth of layers from the n-type GaN optical guide layer 6 to the p-type AlGaN cap layer 9, and a mixed gas atmosphere containing $N_2$ and $H_2$ is used for growth of the p-type AlGaN/GaN superlattice clad layer 18 and the p-type GaN contact layer 12. In this case, since the carrier gas atmosphere used for the growth up to the p-type AlGaN cap layer 9 after the growth of the active layer 7 is the $N_2$ atmosphere and does not contain $H_2$, elimination of In from the active layer 7 is prevented, and the active layer 7 is prevented from deterioration. Additionally, the carrier gas atmosphere used for the growth of the p-type AlGaN/GaN superlattice clad layer 18 and the p-type GaN contact layer 12 is the mixed gas atmosphere containing N₂ and H₂, these p-type layers can be grown in a good crystalline quality.

Figure 8:
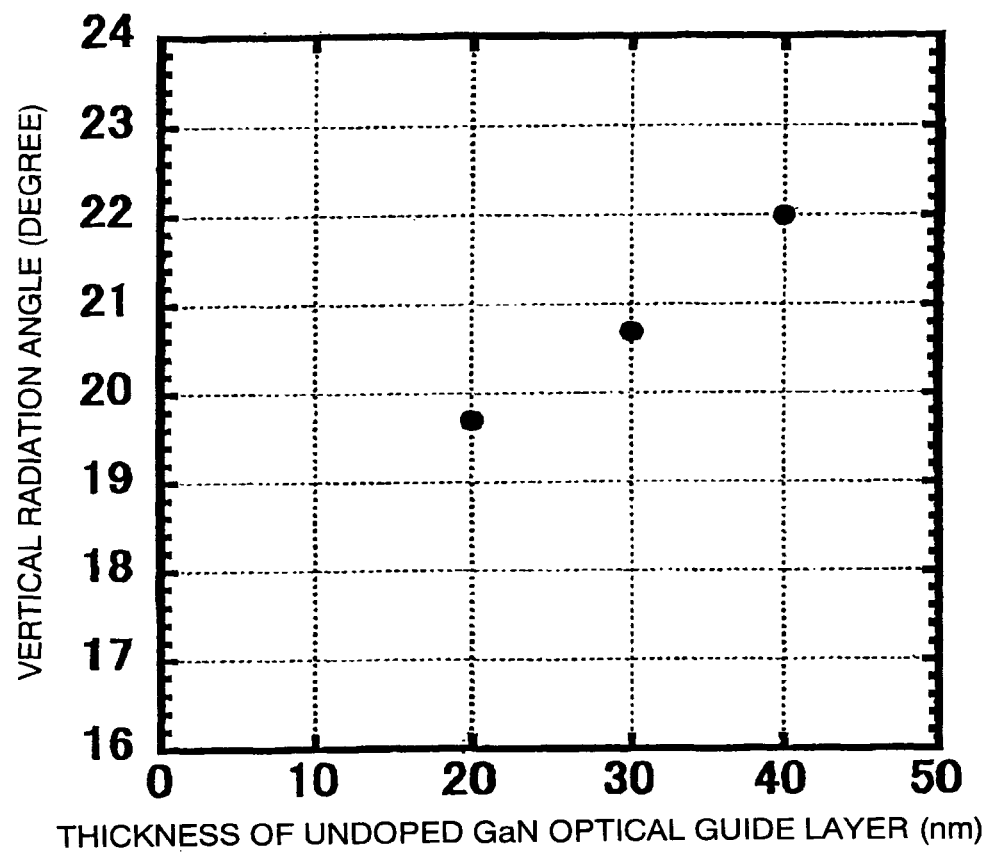
FIG. 8 is a schematic diagram showing measured changes in vertical radiation angle of the GaN compound semiconductor laser according to the fifth embodiment of the invention in response to changes in thickness of an undoped GaN optical guide layer therein.

FIG. 8 shows a result of measurement to know how the vertical beam divergent angle of the semiconductor laser, i.e. its vertical radiation angle (θ⊥), changes with thickness of the undoped GaN optical guide layer 17. It is appreciated from FIG. 8 that the vertical radiation angle can be limited within 19~22 degrees by limiting the thickness of the undoped GaN optical guide layer 17 within 20~40 nm. As compared to vertical radiation angles of conventional GaN semiconductor lasers as large as 27~30 degrees, the vertical radiation angle of the semiconductor laser according to this embodiment is much less.

According to the fifth embodiment, since the semiconductor laser is so configured that the active layer 7, undoped GaN optical guide layer 17, p-type AlGaN cap layer 9 and p-type AlGaN/GaN superlattice clad layer 18 sequentially lie in contact and the undoped GaN optical guide layer 17 is as thin as 20~40 nm, it is possible to significantly reduce the vertical radiation angle of the GaN compound semiconductor laser and thereby reduce the aspect ratio of the radiation angle (θ⊥/θ∥ where θ∥ is the horizontal radiation angle). Moreover, since the p-type AlGaN cap layer 9 is in contact with the p-type AlGaN/GaN superlattice clad layer 18, symmetry of the intensity distribution of light in far-field images can be improved. This type of GaN compound semiconductor laser is especially suitable for use as the light source of an optical disc device.

Additionally, since the undoped GaN optical guide layer 17 is grown in direct contact with the active layer 7, its crystalline quality is improved, and the lifetime of the GaN compound semiconductor laser is elongated accordingly.

Furthermore, since the undoped GaN optical guide layer 17 is as thin as 20~40 nm, and its specific resistance is smaller than that of a p-type GaN optical guide layer doped with Mg as its p-type impurity, serial resistance of the GaN compound semiconductor laser can be reduced, and its drive voltage can be reduced accordingly.

Figure 9:
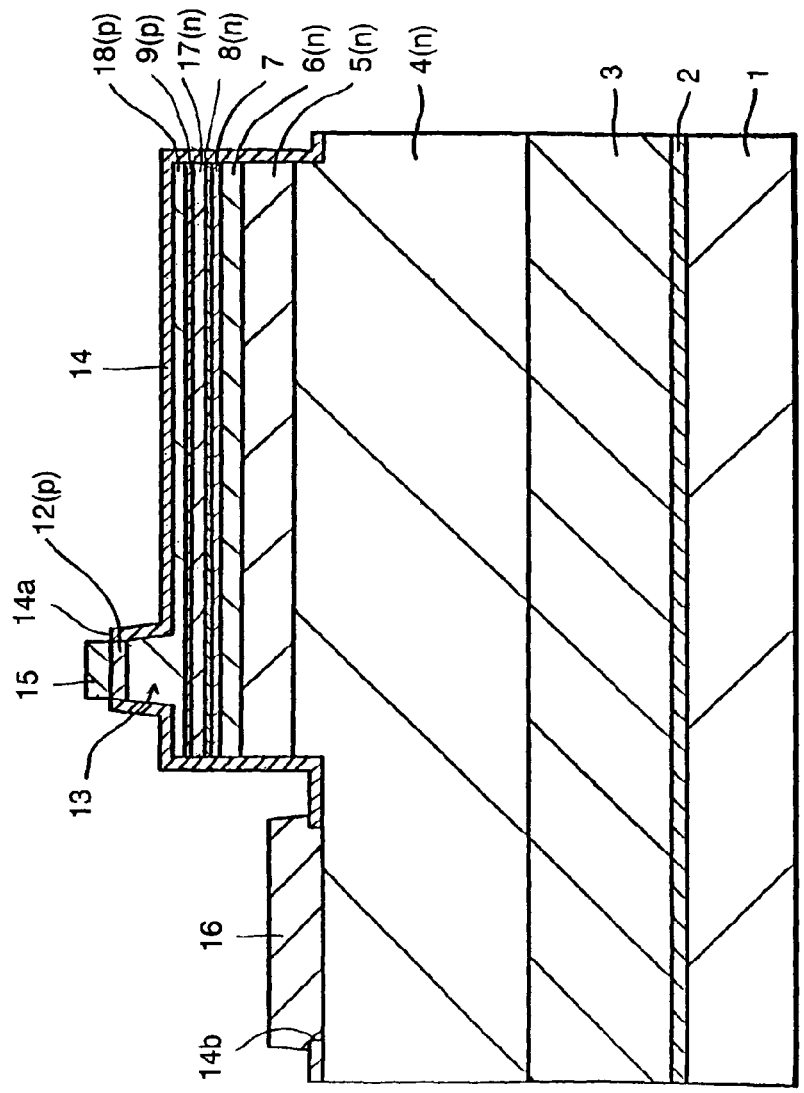
FIG. 9 is a cross-sectional view showing a GaN compound semiconductor laser according to the sixth embodiment of the invention.
Figure 10:
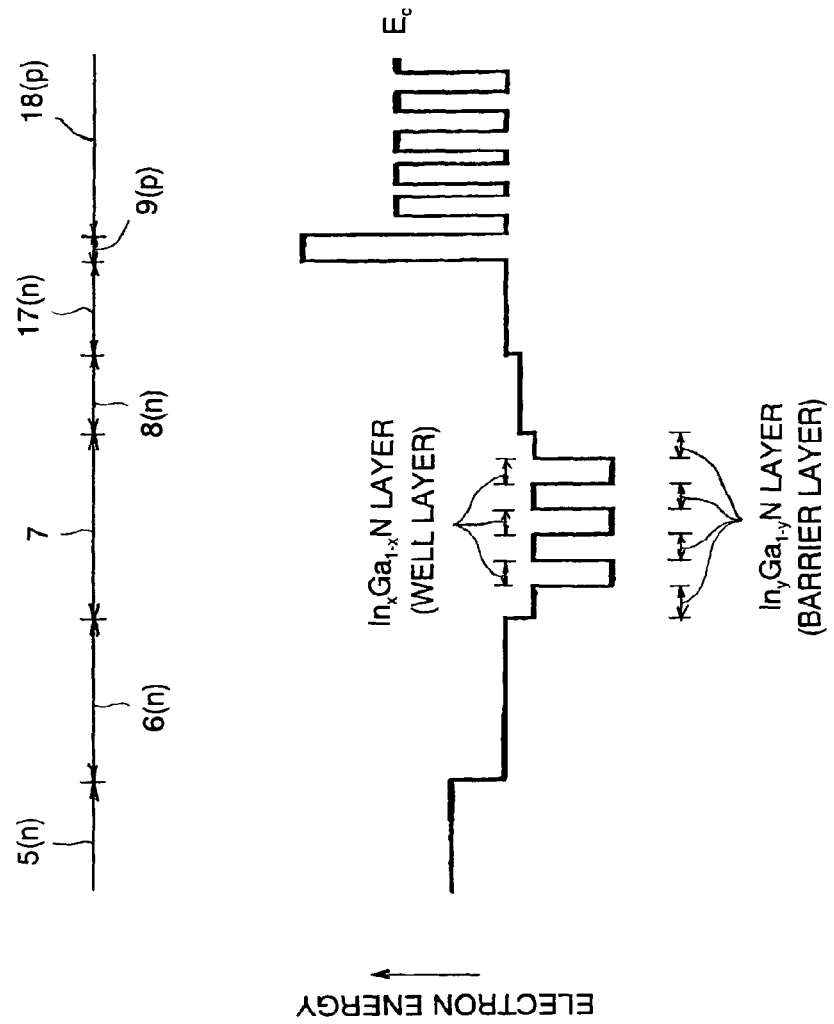
FIG. 10 is a schematic diagram showing an energy band structure of the GaN compound semiconductor laser according to the sixth embodiment of the invention.

Next explained is a GaN compound semiconductor laser according to the sixth embodiment of the invention. FIG. 9 shows the GaN compound semiconductor laser according to the sixth embodiment. FIG. 10 is an energy band diagram of this GaN compound semiconductor laser.

In the GaN compound semiconductor laser according to the sixth embodiment, the undoped InGaN deterioration preventing layer 8 is in contact with the active layer 7; the undoped GaN optical guide layer 17 is in contact with the undoped InGaN deterioration preventing layer 8; the p-type AlGaN cap layer 9 is in contact with the undoped GaN optical guide layer 17; and the p-type AlGaN/GaN superlattice clad layer 18 is in contact with the p-type AlGaN cap layer 9. Indium composition in the undoped InGaN deterioration preventing layer 8 is equal to that of the second embodiment. In the other respects, the structure of the laser shown here is identical to those of the GaN compound semiconductor lasers according to the first and fifth embodiments. So, its explanation is omitted here.

This GaN compound semiconductor laser can be manufactured by essentially the same method as that of the GaN compound semiconductor laser according to the first embodiment. In this embodiment, however, the following special conditions are used for growth temperature and carrier gas when growing individual layers. For example, growth temperature is set at 1000° C. for growth of layers from the undoped GaN layer 3 to the n-type AlGaN clad layer 5, at 800° C. for growth of layers from the n-type GaN optical guide layer 6 to the p-type undoped InGaN deterioration preventing layer 8, at 850° C. for growth of the undoped GaN optical guide layer 17 and the p-type AlGaN cap layer 9, and at 1000° C. for growth of the p-type AlGaN/GaN superlattice clad layer 18 and the p-type GaN contact layer 12. As to carrier gas, a mixed gas atmosphere containing N₂ and H₂ is used for growth of layers from the undoped GaN layer 3 to the n-type AlGaN clad layer 5, a N₂ atmosphere is used for growth of layers from the n-type GaN optical guide layer 6 to the p-type AlGaN cap layer 9, and a mixed gas atmosphere containing N₂ and H₂ is used for growth of the p-type AlGaN/GaN superlattice clad layer 18 and the p-type GaN contact layer 12. In this case, since the carrier gas atmosphere used for the growth up to the p-type AlGaN cap layer 9 after the growth of the active layer 7 is the N₂ atmosphere and does not contain H₂, elimination of In from the active layer 7 is prevented, and the active layer 7 is prevented from deterioration. Additionally, the carrier gas atmosphere used for the growth of the p-type AlGaN/GaN superlattice clad layer 18 and the p-type GaN contact layer 12 is the mixed gas atmosphere containing N₂ and H₂, these p-type layers can be grown in a good crystalline quality.

According to the sixth embodiment, since the semiconductor laser is so configured that the active layer 7, undoped InGaN deterioration preventing layer 8, undoped GaN optical guide layer 17, p-type AlGaN cap layer 9 and p-type AlGaN/GaN superlattice clad layer 18 sequentially lie in contact and the undoped GaN optical guide layer 17 is as thin as 20~40 nm, the same advantages as those of the fifth embodiment can be obtained, and simultaneously, since the undoped InGaN deterioration preventing layer 8 is provided adjacent to the active layer 7, the same advantages as those of the first embodiment can be obtained as well.

Figure 11:
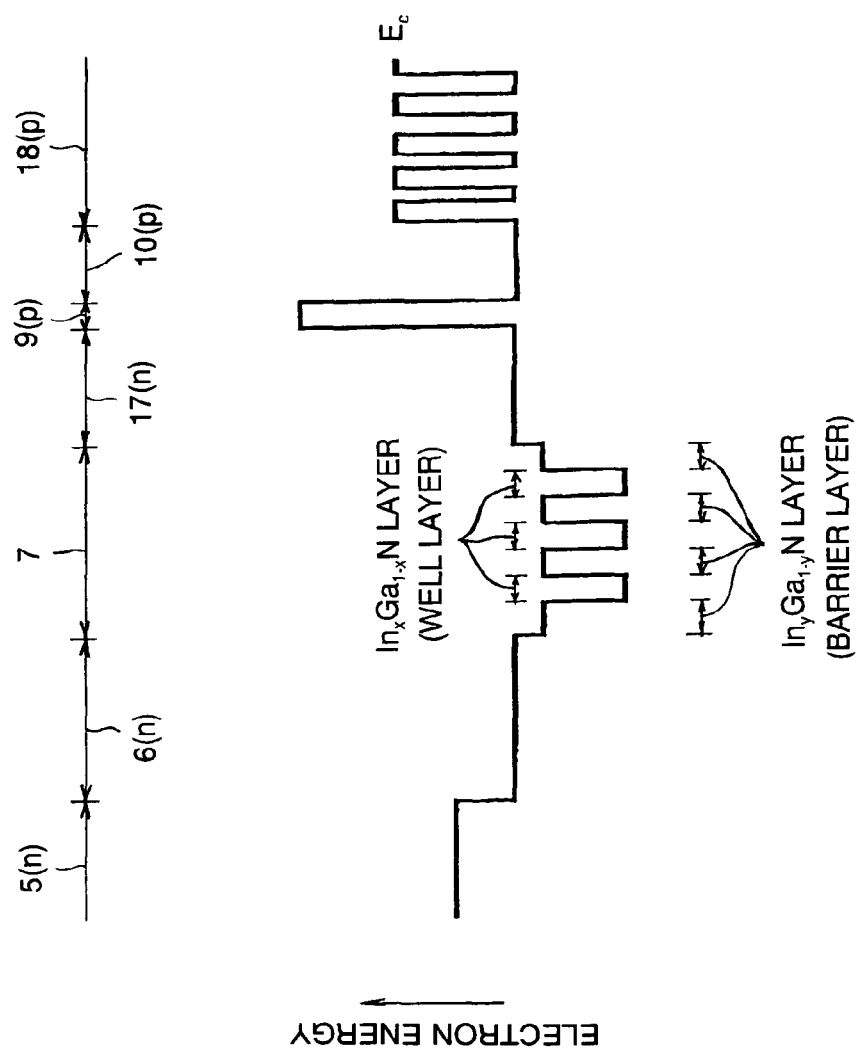
FIG. 11 is a schematic diagram showing an energy band structure of a GaN compound semiconductor laser according to the seventh embodiment of the invention.

Next explained is a GaN compound semiconductor laser according to the seventh embodiment of the invention. FIG. 11 is an energy band diagram of this GaN compound semiconductor laser.

In the GaN compound semiconductor laser according to the seventh embodiment, the undoped GaN optical guide layer 17 is provided in contact with the active layer 7; the p-type AlGaN cap layer 9 is in contact with the undoped GaN optical guide layer 17; the p-type GaN optical guide layer 10 is in contact with the p-type AlGaN cap layer 9; and the p-type AlGaN/GaN superlattice clad layer 18 is in contact with the p-type GaN optical guide layer 10. In the other respects, the structure of the laser shown here is identical to those of the GaN compound semiconductor lasers according to the first and fifth embodiments. So, its explanation is omitted here.

This GaN compound semiconductor laser can be manufactured by essentially the same method as that of the GaN compound semiconductor laser according to the first embodiment. In this embodiment, however, the following special conditions are used for growth temperature and carrier gas when growing individual layers. For example, growth temperature is set at 1000° C. for growth of layers from the undoped GaN layer 3 to the n-type AlGaN clad layer 5, at 800° C. for growth of layers from the n-type GaN optical guide layer 6 to the p-type AlGaN cap layer 9, and at 1000° C. for growth of layers from the p-type GaN optical guide layer 10 to the p-type GaN contact layer 12. As to carrier gas, a mixed gas atmosphere containing N₂ and H₂ is used for growth of layers from the undoped GaN layer 3 to the n-type AlGaN clad layer 5, a N₂ atmosphere is used for growth of layers from the n-type GaN optical guide layer 6 to the p-type AlGaN cap layer 9, and a mixed gas atmosphere containing N₂ and H₂ is used for growth of layers from the p-type GaN optical guide layer 10 to the p-type GaN contact layer 12. In this case, since the carrier gas atmosphere used for the growth up to the p-type AlGaN cap layer 9 after the growth of the active layer 7 is the N₂ atmosphere and does not contain H₂, elimination of In from the active layer 7 is prevented, and the active layer 7 is prevented from deterioration. Additionally, the carrier gas atmosphere used for the growth of the p-type GaN optical guide layer 10, p-type AlGaN/GaN superlattice clad layer 18 and p-type GaN contact layer 12 is the mixed gas atmosphere containing N₂ and H₂, these p-type layers can be grown in a good crystalline quality.

According to the seventh embodiment, since the semiconductor laser is configured such that the active layer 7, undoped InGaN deterioration preventing layer 8, undoped GaN optical guide layer 17, p-type AlGaN cap layer 9 and p-type AlGaN/GaN superlattice clad layer 18 sequentially lie in contact and the undoped GaN optical guide layer 17 is as thin as 20~40 nm, the same advantages as those of the fifth embodiment can be obtained.

Figure 12:
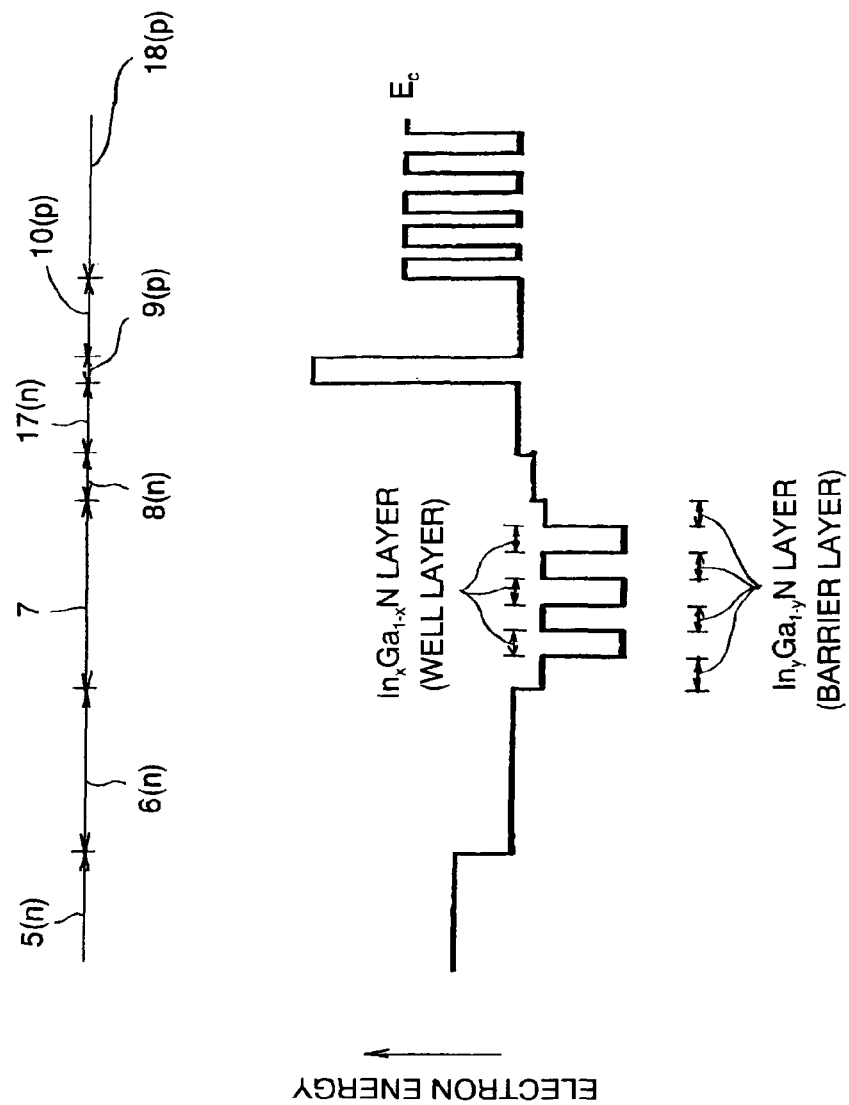
FIG. 12 is a schematic diagram showing an energy band structure of a GaN compound semiconductor laser according to the eighth embodiment of the invention.

Next explained is a GaN compound semiconductor laser according to the eighth embodiment of the invention. FIG. 12 is an energy band diagram of this GaN compound semiconductor laser.

In the GaN compound semiconductor laser according to the eighth embodiment, the undoped InGaN deterioration preventing layer 8 is in contact with the active layer 7; the undoped GaN optical guide layer 17 is provided in contact with the undoped InGaN deterioration preventing layer 8; the p-type AlGaN cap layer 9 is in contact with the undoped GaN optical guide layer 17; the p-type GaN optical guide layer 10 is in contact with the p-type AlGaN cap layer 9; and the p-type AlGaN/GaN superlattice clad layer 18 is in contact with the p-type GaN optical guide layer 10. Indium composition in the undoped InGaN deterioration preventing layer 8 is equal to that of the second embodiment. In the other respects, the structure of the laser shown here is identical to those of the GaN compound semiconductor lasers according to the first and fifth embodiments. So, its explanation is omitted here.

This GaN compound semiconductor laser can be manufactured by essentially the same method as that of the GaN compound semiconductor laser according to the first embodiment. In this embodiment, however, the following special conditions are used for growth temperature and carrier gas when growing individual layers. For example, growth temperature is set at 1000° C. for growth of layers from the undoped GaN layer 3 to the n-type AlGaN clad layer 5, at 800° C. for growth of the n-type GaN optical guide layer 6 and the active layer 7, at 860° C. for growth of layers from the undoped InGaN deterioration preventing layer 8 to the p-type AlGaN cap layer 9, and at 1000° C. for growth of layers from the p-type GaN optical guide layer 10 to the p-type GaN contact layer 12. As to carrier gas, a mixed gas atmosphere containing N₂ and H₂ is used for growth of layers from the undoped GaN layer 3 to the n-type AlGaN clad layer 5, a N₂ atmosphere is used for growth of layers from the n-type GaN optical guide layer 6 to the p-type AlGaN cap layer 9, and a mixed gas atmosphere containing N₂ and H₂ is used for growth of layers from the p-type GaN optical guide layer 10 to the p-type GaN contact layer 12. In this case, since the carrier gas atmosphere used for the growth up to the p-type AlGaN cap layer 9 after the growth of the active layer 7 is the N₂ atmosphere and does not contain H₂, elimination of In from the active layer 7 is prevented, and the active layer 7 is prevented from deterioration. Additionally, the carrier gas atmosphere used for the growth of the p-type GaN optical guide layer 10, p-type AlGaN/GaN superlattice clad layer 18 and p-type GaN contact layer 12 is the mixed gas atmosphere containing N₂ and H₂, these p-type layers can be grown in a good crystalline quality.

According to the eighth embodiment, since the semiconductor laser is configured such that the active layer 7, undoped InGaN deterioration preventing layer 8, undoped GaN optical guide layer 17, p-type AlGaN cap layer 9, p-type GaN optical guide layer 10 and p-type AlGaN/GaN superlattice clad layer 18 sequentially lie in contact and the undoped GaN optical guide layer 17 is as thin as 20~40 nm, the same advantages as those of the fifth embodiment can be obtained. Additionally, since the undoped InGaN deterioration preventing layer is provided in contact with the active layer 7, the same advantages as those of the first embodiment are obtained.

Figure 13:
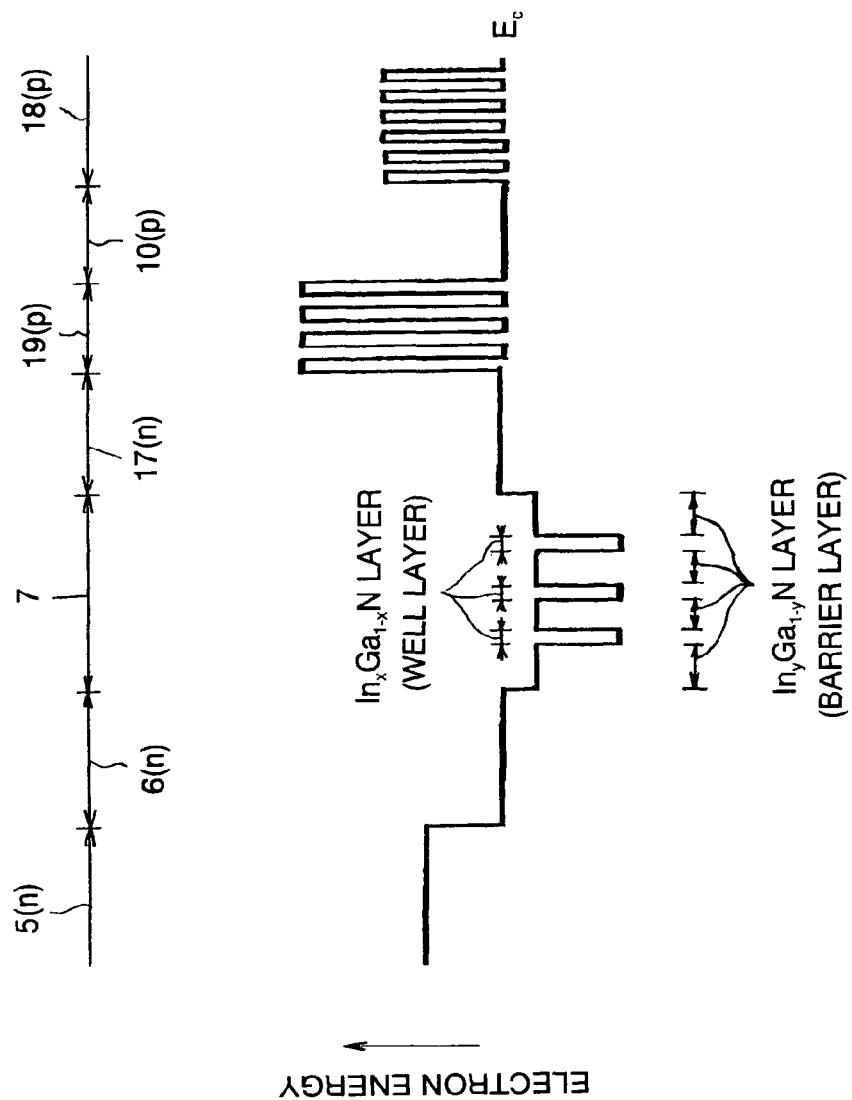
FIG. 13 is a schematic diagram showing an energy band structure of a GaN compound semiconductor laser according to the ninth embodiment of the invention.

Next explained is a GaN compound semiconductor laser according to the ninth embodiment of the invention. FIG. 13 is an energy band diagram of this GaN compound semiconductor laser.

In the GaN compound semiconductor laser according to the ninth embodiment, the undoped GaN optical guide layer 17 is in contact with the active layer 7; a p-type AlGaN/GaN superlattice cap layer 19 is formed in contact with the undoped GaN optical guide layer 17; the p-type GaN optical guide layer 10 is in contact with the p-type AlGaN/GaN superlattice cap layer 19; and the p-type AlGaN/GaN superlattice clad layer 18 is in contact with the p-type GaN optical guide layer 10. The p-type AlGaN/GaN superlattice cap layer 19 has a structure alternately stacking undoped AlGaN layers as barrier layers each having the thickness of 2.5 nm and Al composition of 12%, for example, and Mg-doped GaN layers as well layers each having the thickness of 2.5 nm here again, for example, and the total thickness of the cap layer 19 is, for example, 100 nm. In the other respects, the structure of the laser shown here is identical to that of the GaN compound semiconductor laser according to the first embodiment. So, its explanation is omitted here.

This GaN compound semiconductor laser can be manufactured by essentially the same method as that of the GaN compound semiconductor laser according to the first embodiment. In this embodiment, however, the following special conditions are used for growth temperature and carrier gas when growing individual layers. For example, growth temperature is set at 1000° C. for growth of layers from the undoped GaN layer 3 to the n-type AlGaN clad layer 5, at 800° C. for growth of layers from the n-type GaN optical guide layer 6 to the p-type AlGaN/Gan superlattice cap layer 19, and at 1000° C. for growth of layers from the p-type GaN optical guide layer 10 to the p-type GaN contact layer 12. As to carrier gas, a mixed gas atmosphere containing N₂ and H₂ is used for growth of layers from the undoped GaN layer 3 to the n-type AlGaN clad layer 5, a N₂ atmosphere is used for growth of layers from the n-type GaN optical guide layer 6 to the p-type AlGaN cap layer 9, and a mixed gas atmosphere containing N₂ and H₂ is used for growth of layers from the p-type GaN optical guide layer 10 to the p-type GaN contact layer 12. In this case, since the carrier gas atmosphere used for the growth up to the p-type AlGaN/GaN superlattice cap layer 19 after the growth of the active layer 7 is the N₂ atmosphere and does not contain H₂, elimination of In from the active layer 7 is prevented, and the active layer 7 is prevented from deterioration. Additionally, the carrier gas atmosphere used for the growth of the p-type GaN optical guide layer 10, p-type AlGaN/GaN superlattice clad layer 18 and the p-type GaN contact layer 12 is the mixed gas atmosphere containing N₂ and H₂, these p-type layers can be grown in a good crystalline quality.

According to the ninth embodiment, since the semiconductor laser is configured such that the active layer 7, undoped GaN optical guide layer 17, p-type AlGaN/GaN superlattice cap layer 19, p-type GaN optical guide layer 10 and p-type AlGaN/GaN superlattice clad layer 18 and sequentially lie in contact and the undoped GaN optical guide layer 17 is as thin as 20~40 nm, the same advantages as those of the fifth embodiment can be obtained.

Figure 14:
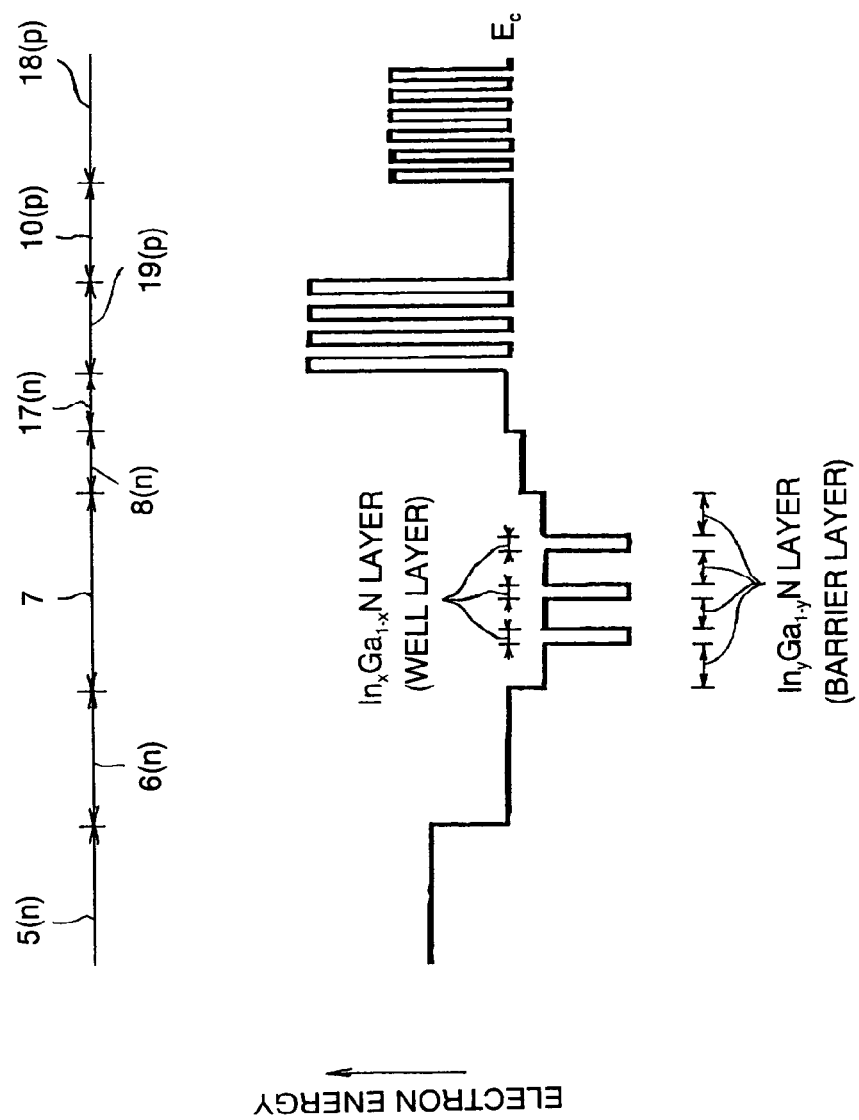
FIG. 14 is a schematic diagram showing an energy band structure of a GaN compound semiconductor laser according to the tenth embodiment of the invention.

Next explained is a GaN compound semiconductor laser according to the tenth embodiment of the invention. FIG. 14 is an energy band diagram of this GaN compound semiconductor laser.

In the GaN compound semiconductor laser according to the tenth embodiment, the undoped InGaN deterioration preventing layer 8 is in contact with the active layer 7; the undoped GaN optical guide layer 17 is formed in contact with the undoped InGaN deterioration preventing layer 8; the p-type AlGaN/GaN superlattice cap layer 19 is formed in contact with the undoped GaN optical guide layer 17; the p-type GaN optical guide layer 10 is in contact with the p-type AlGaN/GaN superlattice cap layer 19; and the p-type AlGaN/GaN superlattice clad layer 18 is in contact with the p-type GaN optical guide layer 10. Indium composition in the undoped InGaN deterioration preventing layer 8 is equal to that of the second embodiment. In the other respects, the structure of the laser shown here is identical to those of the GaN compound semiconductor lasers according to the first and fifth embodiments. So, its explanation is omitted here.

This GaN compound semiconductor laser can be manufactured by essentially the same method as that of the GaN compound semiconductor laser according to the first embodiment. In this embodiment, however, the following special conditions are used for growth temperature and carrier gas when growing individual layers. For example, growth temperature is set at 1000° C. for growth of layers from the undoped GaN layer 3 to the n-type AlGaN clad layer 5, at 800° C. for growth of layers from the n-type GaN optical guide layer 6 to the undoped InGaN deterioration preventing layer 8, at 870° C. for growth of the undoped GaN optical guide layer 17 and the p-type AlGaN/Gan superlattice cap layer 19, and at 1000° C. for growth of layers from the p-type GaN optical guide layer 10 to the p-type GaN contact layer 12. As to carrier gas, a mixed gas atmosphere containing $N_2$ and $H_2$ is used for growth of layers from the undoped GaN layer 3 to the n-type AlGaN clad layer 5, a $N_2$ atmosphere is used for growth of layers from the n-type GaN optical guide layer 6 to the p-type AlGaN/GaN superlattice cap layer 19, and a mixed gas atmosphere containing $N_2$ and $H_2$ is used for growth of layers from the p-type GaN optical guide layer 10 to the p-type GaN contact layer 12. In this case, since the carrier gas atmosphere used for the growth up to the p-type AlGaN/GaN superlattice cap layer 19 after the growth of the active layer 7 is the $N_2$ atmosphere and does not contain $H_2$, elimination of In from the active layer 7 is prevented, and the active layer 7 is prevented from deterioration. Additionally, the carrier gas atmosphere used for the growth of the p-type GaN optical guide layer 10, p-type AlGaN/GaN superlattice clad layer 18 and p-type GaN contact layer 12 is the mixed gas atmosphere containing $N_2$ and $H_2$, these p-type layers can be grown in a good crystalline quality.

According to the tenth embodiment, since the semiconductor laser is configured such that the active layer 7, undoped InGaN deterioration preventing layer 8, undoped GaN optical guide layer 17, p-type AlGaN/GaN superlattice cap layer 19, p-type GaN optical guide layer 10 and p-type AlGaN/GaN superlattice clad layer 18 and sequentially lie in contact and the undoped GaN optical guide layer 17 is as thin as 20~40 nm, the same advantages as those of the fifth embodiment can be obtained. Additionally, since the undoped InGaN deterioration preventing layer 8 is formed adjacent to the active layer 7, the same advantages as those of the first embodiment are obtained.

Figure 15:
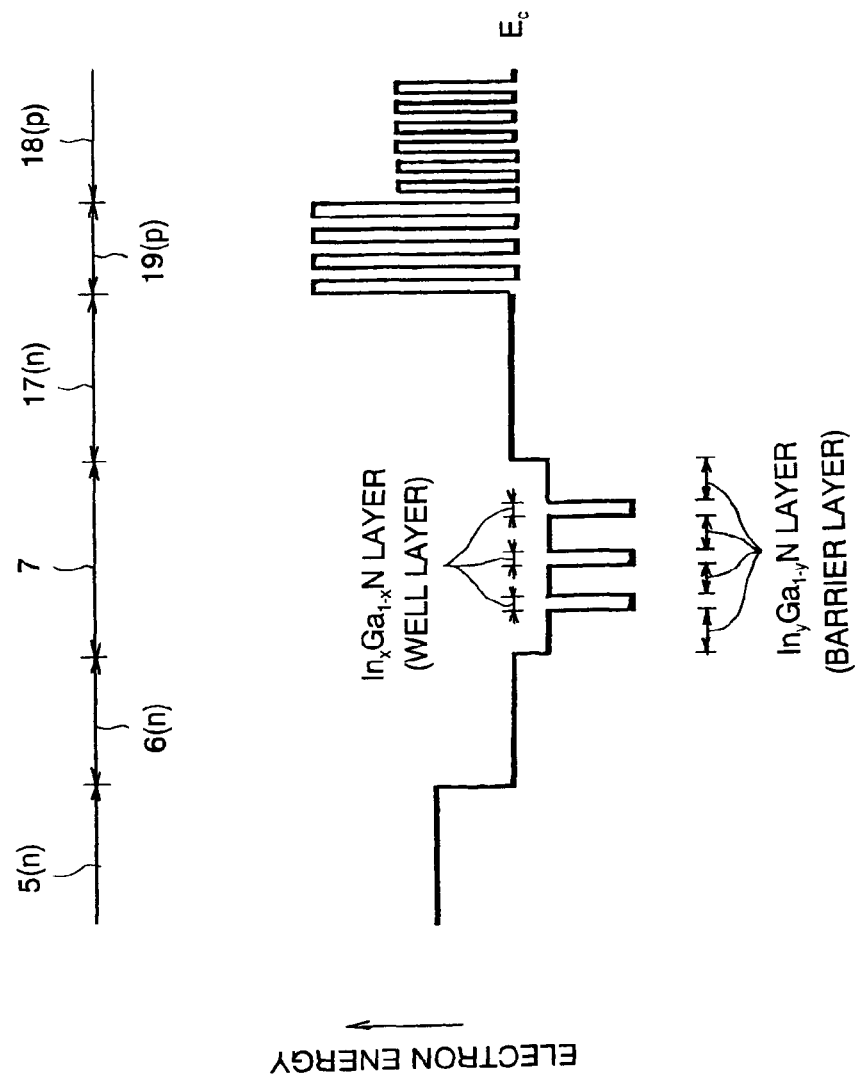
FIG. 15 is a schematic diagram showing an energy band structure of a GaN compound semiconductor laser according to the eleventh embodiment of the invention.

Next explained is a GaN compound semiconductor laser according to the eleventh embodiment of the invention. FIG. 15 is an energy band diagram of this GaN compound semiconductor laser.

In the GaN compound semiconductor laser according to the eleventh embodiment, the undoped GaN optical guide layer 17 is formed in contact with the active layer 7; the p-type AlGaN/GaN superlattice cap layer 19 is formed in contact with the undoped GaN optical guide layer 17; and the p-type AlGaN/GaN superlattice clad layer 18 is formed in contact with the p-type AlGaN/GaN superlattice cap layer 19. In the other respects, the structure of the laser shown here is identical to those of the GaN compound semiconductor lasers according to the first, fifth and ninth embodiments. So, its explanation is omitted here.

This GaN compound semiconductor laser can be manufactured by essentially the same method as that of the GaN compound semiconductor laser according to the first embodiment. In this embodiment, however, the following special conditions are used for growth temperature and carrier gas when growing individual layers. For example, growth temperature is set at 1000° C. for growth of layers from the undoped GaN layer 3 to the n-type AlGaN clad layer 5, at 800° C. for growth of layers from the n-type GaN optical guide layer 6 to the p-type AlGaN/Gan superlattice cap layer 19, and at 1000° C. for growth of layers from the p-type GaN optical guide layer 10 to the p-type GaN contact layer 12. As to carrier gas, a mixed gas atmosphere containing $N_2$ and $H_2$ is used for growth of layers from the undoped GaN layer 3 to the n-type AlGaN clad layer 5, a $N_2$ atmosphere is used for growth of layers from the n-type GaN optical guide layer 6 to the p-type AlGaN/GaN superlattice cap layer 19, and a mixed gas atmosphere containing $N_2$ and $H_2$ is used for growth of layers from the p-type GaN optical guide layer 10 to the p-type GaN contact layer 12. In this case, since the carrier gas atmosphere used for the growth up to the p-type AlGaN/GaN superlattice cap layer 19 after the growth of the active layer 7 is the $N_2$ atmosphere and does not contain $H_2$, elimination of In from the active layer 7 is prevented, and the active layer 7 is prevented from deterioration. Additionally, the carrier gas atmosphere used for the growth of the p-type AlGaN/GaN superlattice clad layer 18 and the p-type GaN contact layer 12 is the mixed gas atmosphere containing $N_2$ and $H_2$, these p-type layers can be grown in a good crystalline quality.

According to the eleventh embodiment, since the semiconductor laser is configured such that the active layer 7, undoped GaN optical guide layer 17, p-type AlGaN/GaN superlattice cap layer 19 and p-type AlGaN/GaN superlattice clad layer 18 sequentially lie in contact and the undoped GaN optical guide layer 17 is as thin as 20~40 nm, the same advantages as those of the fifth embodiment can be obtained.

Figure 16:
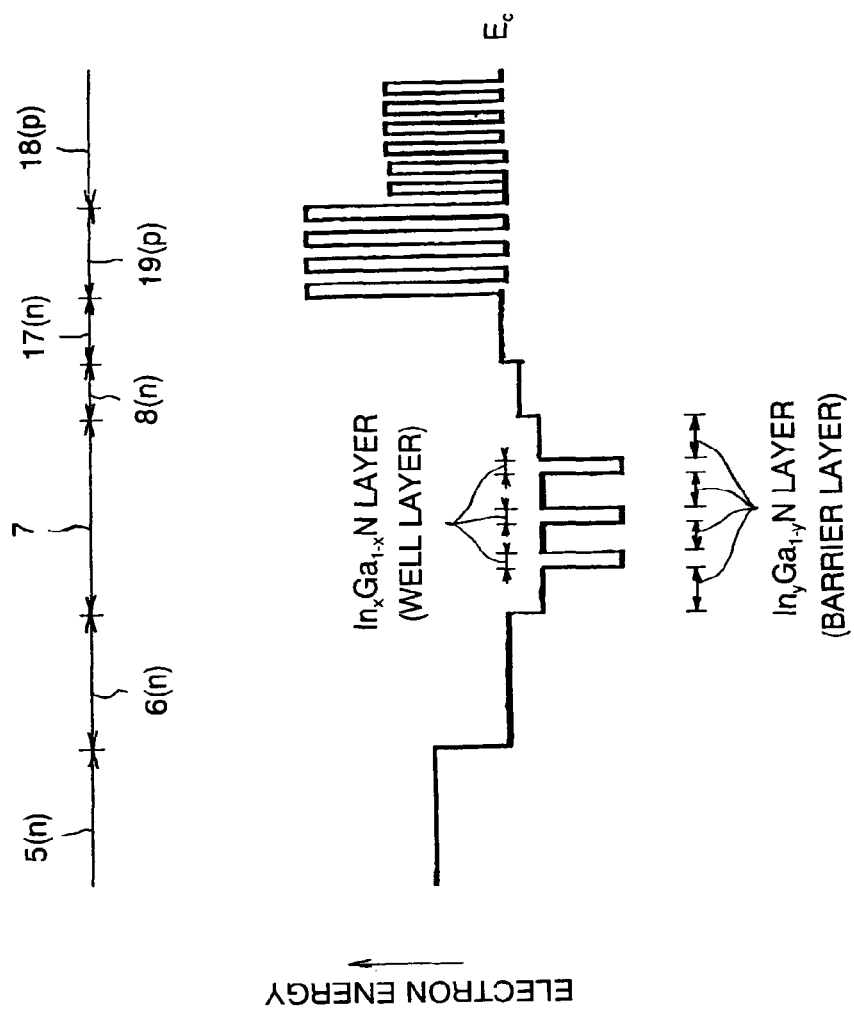
FIG. 16 is a schematic diagram showing an energy band structure of a GaN compound semiconductor laser according to the twelfth embodiment of the invention.

Next explained is a GaN compound semiconductor laser according to the twelfth embodiment of the invention. FIG. 16 is an energy band diagram of this GaN compound semiconductor laser.

In the GaN compound semiconductor laser according to the twelfth embodiment, the undoped InGaN deterioration preventing layer 8 is formed in contact with the active layer 7; the undoped GaN optical guide layer 17 is formed in contact with the undoped InGaN deterioration preventing layer 8; the p-type AlGaN/GaN superlattice cap layer 19 is formed in contact with the undoped GaN optical guide layer 17; and the p-type AlGaN/GaN superlattice clad layer 18 is formed in contact with the p-type AlGaN/GaN superlattice cap layer 19. Indium composition in the undoped GaN optical guide layer 17 is equal to that of the second embodiment. In the other respects, the structure of the laser shown here is identical to those of the GaN compound semiconductor lasers according to the first, fifth and ninth embodiments. So, its explanation is omitted here.

This GaN compound semiconductor laser can be manufactured by essentially the same method as that of the GaN compound semiconductor laser according to the first embodiment. In this embodiment, however, the following special conditions are used for growth temperature and carrier gas when growing individual layers. For example, growth temperature is set at 1000° C. for growth of layers from the undoped GaN layer 3 to the n-type AlGaN clad layer 5, at 800° C. for growth of layers from the n-type GaN optical guide layer 6 to the undoped GaN deterioration preventing layer 8, at 880° C. for growth of the undoped GaN optical guide layer 17 and the p-type AlGaN/Gan superlattice cap layer 19, and at 1000° C. for growth of layers from the p-type GaN optical guide layer 10 to the p-type GaN contact layer 12. As to carrier gas, a mixed gas atmosphere containing $N_2$ and $H_2$ is used for growth of layers from the undoped GaN layer 3 to the n-type AlGaN clad layer 5, a $N_2$ atmosphere is used for growth of layers from the n-type GaN optical guide layer 6 to the undoped GaN deterioration preventing layer 8, and a mixed gas atmosphere containing $N_2$ and $H_2$ is used for growth of the p-type AlGaN/GaN superlattice clad layer 18 and the p-type GaN contact layer 12. In this case, since the carrier gas atmosphere used for the growth up to the p-type AlGaN/GaN superlattice cap layer 19 after the growth of the active layer 7 is the $N_2$ atmosphere and does not contain $H_2$, elimination of In from the active layer 7 is prevented, and the active layer 7 is prevented from deterioration. Additionally, the carrier gas atmosphere used for the growth of the p-type AlGaN/GaN superlattice clad layer 18 and the p-type GaN contact layer 12 is the mixed gas atmosphere containing $N_2$ and $H_2$, these p-type layers can be grown in a good crystalline quality.

According to the twelfth embodiment, since the semiconductor laser is configured such that the active layer 7, undoped GaN deterioration preventing layer 8, undoped GaN optical guide layer 17, p-type AlGaN/GaN superlattice cap layer 19 and p-type AlGaN/GaN superlattice clad layer 18 sequentially lie in contact and the undoped GaN optical guide layer 17 is as thin as 20~40 nm, the same advantages as those of the fifth embodiment can be obtained. Additionally, since the undoped InGaN deterioration preventing layer 8 is provided adjacent to the active layer, the same advantages as those of the first embodiment are obtained.

Heretofore, embodiments of the invention have been explained specifically. However, the invention is not limited to those embodiments but contemplates various changes and modifications based on the technical concept of the invention.

For example, numerical values, structures, substrates, source materials, processes, and the like, specifically indicated in conjunction with the first to twelfth embodiments are not but examples, and any appropriate numerical values, structures, substrates, source materials, processes, etc. may be used.

More specifically, for example, although the first to twelfth embodiments have been explained as first depositing n-type layers of the laser structure on the substrate and thereafter depositing p-type layers. However, the order of deposition may be opposite to first deposit p-type layers on the substrate and thereafter deposit n-type layers.

Further, the first to twelfth embodiments use the c-plane sapphire substrate, but a SiC substrate, Si substrate or spinel substrate, for example, may be used instead, where appropriate. Furthermore, an MN buffer layer or AlGaN buffer layer may be used instead of the GaN buffer layer.

The first to twelfth embodiments have been explained as applying the invention to the manufacture of a GaN compound semiconductor laser of a SCH structure. Instead, the invention is applicable to the manufacture of a GaN compound semiconductor laser of a DH structure (double heterostructure), for example, or to the manufacture of a GaN compound light emitting diode, or further to an electron transporting device using nitride III-V compound semiconductors, such as GAN compound FET, GaN compound heterojunction bipolar transistor (HBT), for example.

The first and second embodiments have been explained as using $H_2$ gas as the carrier gas for growth by MOCVD. However, any other appropriate gas such as a mixed gas of $H_2$ and $N_2$, or with He or Ar gas.

As described above, according to the invention, since an intermediate layer of a second nitride III-V compound semiconductor containing In and Ga but different from a first nitride III-V compound semiconductor is provided in contact with an active layer of the first nitride III-V compound semiconductor containing In and Ga or a layer of the first nitride III-V compound semiconductor, the intermediate layer significantly alleviates the stress produced in the active layer or the layer of the first nitride III-V compound semiconductor by a cap layer, or the like, or effectively prevents diffusion of Mg used as a p-type dopant of p-type layers into the active layer or the layer of nitride III-V compound semiconductor. Thereby, the invention can realize a semiconductor device using nitride III-V compound semiconductors, which is sufficiently reduced in initial deterioration rate, elongated in lifetime, remarkably reduced in change of the operation current with time, and remarkably reduced in emission unevenness. Such a semiconductor device, which may be a semiconductor light emitting device, can be manufactured easily by the manufacturing method according to the invention.

Additionally, by optimizing the position of the cap layer, the optical guide layer or the first optical guide layer can be grown in a good crystalline quality as compared with a structure locating the cap layer adjacent to the active layer with or without interposing the intermediate layer, or the optical guide layer or the first optical guide layer can be optimized in thickness. Therefore, it is possible to realize a semiconductor light emitting device made of nitride III-V compound semiconductors, which is elongated in life, enhanced in symmetry of intensity distribution of light in far-field images especially in case of a semiconductor laser and improved in aspect ratio of the radiation angle, or a semiconductor device made of nitride III-V compound semiconductors, which is elongated in lifetime. Such a semiconductor light emitting device or semiconductor device can be manufactured easily by the manufacturing method according to the invention.

What is claimed is:

1. A semiconductor light emitting device including:
   an active layer made of a first nitride III-V compound semiconductor containing In and Ga;
   an intermediate layer in contact with the active layer and made of a second nitride III-V compound semiconductor containing In and Ga and different from the first nitride III-V compound semiconductor;
   a cap layer in contact with the intermediate layer and made of a third nitride III-V compound semiconductor containing Al and Ga;

an optical guide layer in contact with the cap layer and made of a sixth nitride III-V compound semiconductor containing Ga; and a p-type clad layer in contact with the cap layer and made of a seventh nitride III-V compound semiconductor containing Al and Ga and different from the third nitride III-V compound semiconductor, wherein, the active layer, the intermediate layer, the cap layer and the optical guide layer are grown in a carrier gas atmosphere containing substantially no hydrogen and containing nitrogen as the major component thereof; and the p-type clad layer are grown in a carrier gas atmosphere containing nitrogen and hydrogen as major components thereof.

2. The semiconductor light emitting device of claim 1, wherein the carrier gas atmosphere containing substantially no hydrogen and containing nitrogen as the major component thereof is a $N_2$ gas atmosphere.

3. The semiconductor light emitting device of claim 1, wherein the carrier gas atmosphere containing nitrogen and hydrogen as major components thereof is a mixed gas atmosphere of $N_2$ and $H_2$.

4. A semiconductor light emitting device including:

an active layer made of a first nitride III-V compound semiconductor containing In and Ga;

an intermediate layer in contact with the active layer and made of a second nitride III-V compound semiconductor containing In and Ga and different from the first nitride III-V compound semiconductor;

a cap layer in contact with the intermediate layer and made of a third nitride III-V compound semiconductor containing Al and Ga;

an optical guide layer in contact with the cap layer and made of a sixth nitride III-V compound semiconductor containing Ga; and a p-type clad layer in contact with the cap layer and made of a seventh nitride III-V compound semiconductor containing Al and Ga and different from the third nitride III-V compound semiconductor, wherein, the active layer, intermediate layer, the cap layer and the optical guide layer are grown at a growth temperature lower than the growth temperature of the p-type clad layer.

5. The semiconductor light emitting device of claim 4, wherein the active layer and the intermediate layer are grown at a growth temperature lower than that of the first optical guide layer and the cap layer.

* * * * *